(12) United States Patent
Kim et al.

(10) Patent No.: US 8,643,075 B2
(45) Date of Patent: Feb. 4, 2014

(54) SEMICONDUCTOR DEVICE HAVING GLUE LAYER AND SUPPORTER

(75) Inventors: Wan-Don Kim, Yongin-si (KR);
Beom-Seok Kim, Suwon-si (KR);
Yong-Suk Tak, Seoul (KR); Kyu-Ho Cho, Hwaseong-si (KR); Seung-Hwan Lee, Suwon-si (KR); Oh-Seong Kwon, Hwaseong-si (KR); Geun-Kyu Choi, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 118 days.

(21) Appl. No.: 13/182,916

(22) Filed: Jul. 14, 2011

(65) Prior Publication Data
US 2012/0086014 A1    Apr. 12, 2012

(30) Foreign Application Priority Data
Oct. 6, 2010   (KR) .................. 10-2010-0097361

(51) Int. Cl.
*H01L 27/108*     (2006.01)
*H01L 29/94*      (2006.01)

(52) U.S. Cl.
USPC .................................. 257/306; 257/E27.048

(58) Field of Classification Search
USPC .................................. 257/300, 306, E27.048
See application file for complete search history.

(56) References Cited

U.S. PATENT DOCUMENTS

| | | | |
|---|---|---|---|
| 6,667,502 B1 | 12/2003 | Agarwal et al. | |
| 7,064,028 B2 | 6/2006 | Ito et al. | |
| 7,871,891 B2 | 1/2011 | Cho et al. | |
| 2009/0014833 A1 | 1/2009 | Yoon et al. | |
| 2009/0102017 A1 | 4/2009 | Bae et al. | |
| 2011/0115051 A1 | 5/2011 | Kim et al. | |

FOREIGN PATENT DOCUMENTS

| | | | |
|---|---|---|---|
| KR | 20040059783 A | 7/2004 | |
| KR | 20080065123 A | 7/2008 | |
| KR | 20080084391 A | 9/2008 | |
| KR | 100890049 B1 | 3/2009 | |
| KR | 1020090068774 A | 6/2009 | |
| KR | 1020090068776 A | 6/2009 | |
| KR | 20090110692 A | 10/2009 | |
| KR | 20090110692 A | 10/2009 | |
| KR | 20100051344 A | 5/2010 | |
| KR | 20110060749 A | 6/2011 | |
| KR | 1020110073097 A | 6/2011 | |

*Primary Examiner* — William D Coleman
(74) *Attorney, Agent, or Firm* — Harness, Dickey & Pierce, P.L.C.

(57) ABSTRACT

A plurality of metal patterns are disposed on a substrate. A support structure is provided between the plurality of metal patterns. The support structure has a supporter and a glue layer. Each of the plurality of metal patterns has a greater vertical length than a horizontal length on the substrate when viewed from a cross-sectional view. The supporter has a band gap energy of at least 4.5 eV. The glue layer is in contact with the plurality of metal patterns. The supporter and the glue layer are formed of different materials.

17 Claims, 23 Drawing Sheets

SEMICONDUCTOR DEVICE HAVING GLUE LAYER AND SUPPORTER

CROSS-REFERENCE TO RELATED APPLICATION

This application claims priority under 35 U.S.C. §119 to Korean Patent Application No. 10-2010-0097361, filed on Oct. 6, 2010, the disclosure of which is hereby incorporated by reference in its entirety.

BACKGROUND

1. Field

Some example embodiments of the inventive concepts relate to a semiconductor device employing a conductive pattern having a high aspect ratio and/or a method of fabricating the same.

2. Description of Related Art

Research aimed at preventing or reducing a lower electrode from moving downward in forming a capacitor has been underway.

SUMMARY

Some example embodiments of the inventive concepts provide a support structure capable of preventing a lower electrode from moving downward, a semiconductor device employing the same, and/or a fabrication method thereof.

Problems to be resolved in the inventive concepts are not limited to the above, and other problems that are not described may be apparently understood by one of ordinary skill in the art based on the following descriptions.

In accordance with an example embodiment, a semiconductor device is provided. The semiconductor device includes a plurality of metal patterns on a substrate. A support structure is provided between the plurality of metal patterns. The support structure has a supporter and a glue layer. Each of the plurality of metal patterns has a greater vertical length than a horizontal length on the substrate when viewed from a cross-sectional view. The supporter has a band gap energy of at least 4.5 eV. The glue layer is in contact with the plurality of metal patterns. The supporter and the glue layer are formed of different materials.

In some example embodiments, the supporter may have a dielectric constant of 10 or smaller. In other example embodiments, the supporter may be formed of at least one of a SiN layer, a SiCN layer, a SiON layer and a combination thereof. The glue layer may be formed of at least one of a TaO layer, a TiO layer and a combination thereof.

In still other example embodiments, the support structure may have a smaller thickness than the vertical length of the plurality of metal patterns when viewed from a cross-sectional view, and the distance between the support structure and lower portions of the plurality of metal patterns may be greater than that between the support structure and upper portions of the plurality of metal patterns when viewed from a cross-sectional view.

In yet other example embodiments, the glue layer may be formed between the supporter and the plurality of metal patterns. The glue layer may be in contact with the supporter. In yet other example embodiments, the glue layer may be connected between the plurality of metal patterns.

In yet other example embodiments, the glue layer may be attached to at least one of surface of the supporter. In yet other example embodiments, the glue layer may include an upper glue layer formed on a first surface of the supporter, and a lower glue layer formed on a second surface of the supporter, the second surface opposing the first surface.

In yet other example embodiments, an insulating layer on the substrate and landing pads in the insulating layer may be provided. An etch stop layer may be formed on the insulating layer. An auxiliary glue layer may be interposed between the etch stop layer and the plurality of metal patterns. The plurality of metal patterns may penetrate the etch stop layer to be in contact with the landing pads.

Further, in accordance with another example embodiment, a semiconductor device is provided. The device includes switching devices on a substrate. Landing pads connected to the switching devices are provided. First and second electrodes are disposed on the landing pads. A support structure is provided between the first and second electrodes. The support structure has a supporter and a glue layer. The glue layer is attached to at least one surface of the supporter. The glue layer is in contact with the first and second electrodes. The supporter and the glue layer are formed of different materials.

In other example embodiments, the at least one surface of the supporter includes first and second surfaces, the glue layer may include an upper glue layer formed on the first surface of the supporter, and a lower glue layer formed on the second surface of the supporter, the second surface opposing the first surface. In still other example embodiments, the glue layer may be thinner than the supporter when viewed from a cross-sectional view.

In yet other example embodiments, the supporter may include an upper supporter formed on a first surface of the glue layer, and a lower supporter formed on a second surface of the glue layer, the second surface opposing the first surface. An intermediate insulating layer may be provided between the upper and lower supporters. The intermediate insulating layer may be formed of a material layer having an etch selectivity with respect to the upper and lower supporters. In this case, the glue layer may be formed between the intermediate insulating layer and the first and second electrodes. Furthermore, the glue layer may be elongated between the upper supporter and the first and second electrodes.

In accordance with an example embodiment, a semiconductor device is provided. The semiconductor device includes a support structure disposed between the first and second electrodes. The support structure has a supporter and a glue layer formed of different materials. The glue layer is attached to at least one surface of the supporter and in contact with the first and second electrodes.

In example embodiments, the at least one surface of the supporter includes first and second surfaces, the glue layer may include an upper glue layer formed on the first surface of the supporter, and a lower glue layer formed on the second surface of the supporter, the second surface opposing the first surface. In still other example embodiments, the glue layer may be thinner than the supporter when viewed from a cross-sectional view.

In yet other example embodiments, the supporter may include an upper supporter formed on a first surface of the glue layer, and a lower supporter formed on a second surface of the glue layer, the second surface opposing the first surface. In other example embodiments, the device may further include an intermediate insulating layer disposed between the upper and lower supporters. The intermediate insulating layer may have an etch selectivity with respect to the upper and lower supporters, and the glue layer may be formed between the intermediate insulating layer and the first and second electrodes.

Details of other example embodiments of the inventive concepts are included in the detailed description and the drawings.

BRIEF DESCRIPTION OF THE DRAWINGS

The foregoing and other features and advantages of the inventive concepts will be apparent from the more particular description of example embodiments of the inventive concepts, as illustrated in the accompanying drawings in which like reference characters refer to the same parts throughout the different views. The drawings are not necessarily to scale, emphasis instead being placed upon illustrating the principles of the inventive concepts. In the drawings.

DETAILED DESCRIPTION OF EXAMPLE EMBODIMENTS

Figure 1:
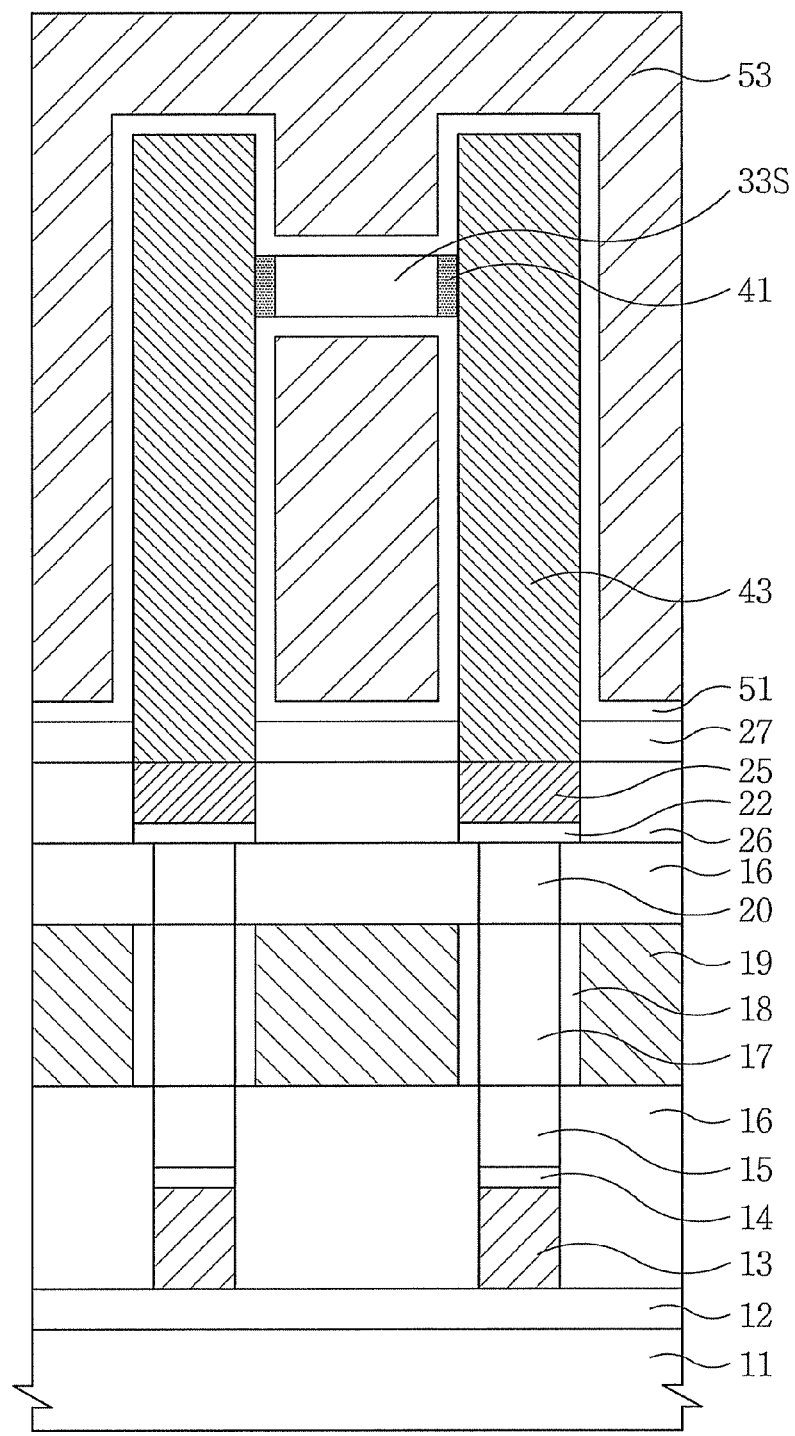
FIG. 1 is a cross-sectional view of a semiconductor device according to a first example embodiment of the inventive concepts.

Various embodiments will now be described more fully with reference to the accompanying drawings in which some embodiments are shown. The inventive concepts may, however, be embodied in different forms and should not be construed as limited to the example embodiments set forth herein. Rather, these example embodiments are provided so that this disclosure is thorough and complete and fully conveys the scope of the inventive concepts to one skilled in the art. In the drawings, the thickness of layers and regions may be exaggerated for clarity. Also, when it is referred that a layer is "on" another layer or a substrate, it may be directly formed on another layer or the substrate or a third layer may be interposed therebetween. Like reference numerals designate like elements throughout the specification.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the inventive concepts.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the inventive concepts. As used herein, the singular forms "a," "an" and "the" are intended to include the plural forms as well, unless the context clearly indicates otherwise. It will be further understood that the terms "comprises," "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which the inventive concepts belong. It will be further understood that terms used herein should be interpreted as having a meaning that is consistent with their meaning in the context of this disclosure and the relevant art and will not be interpreted in an idealized or overly formal sense unless expressly so defined herein.

First Embodiment

A semiconductor device according to a first example embodiment of the inventive concepts will be described below with reference to FIGS. 1 to 6.

Referring to FIG. 1, a buried insulating layer 12, a bit line 13, a first barrier layer 14, a first source/drain region 15, an interlayer insulating layer 16, an active pillar 17, a gate dielectric layer 18, a gate electrode 19 and a second source/drain region 20 may be provided on a substrate 11. The first source/drain region 15, the active pillar 17, the gate dielectric layer 18, the gate electrode 19 and the second source/drain region 20 may constitute a transistor. The plurality of transistors may be disposed on the substrate 11 in columns and rows in a repeated manner. The transistor may function as a switching device.

The substrate 11 may be formed of a semiconductor substrate such as a silicon wafer. The buried insulating layer 12 may cover a surface of the substrate 11. The buried insulating layer 12 may be a substrate glue layer. In this case, the buried insulating layer 12 may be formed of a silicon oxide layer. The interlayer insulating layer 16 may cover the buried insulating layer 12. The transistor may be formed in the interlayer insulating layer 16. Top surfaces of the interlayer insulating layer 16 and the second source/drain region 20 may be exposed on the same planar surface. The interlayer insulating layer 16 may be formed of a silicon oxide layer, a silicon nitride layer, a silicon oxynitride layer, a low-K dielectric layer or a combination thereof. In some example embodiments, the substrate 11 may be formed of a flexible printed circuit board, a rigid printed circuit board, a rigid-flexible printed circuit board, a glass plate, a metal plate or a combination thereof.

A plurality of bit lines 13 may be arranged in parallel on the buried insulating layer 12. The first barrier layer 14 may cover the bit line 13. The bit line 13 may be formed of a metal layer, a metal silicide layer, a semiconductor layer or a combination thereof. For example, the bit line 13 may be formed of a tungsten (W) layer, and the first barrier layer 14 may be formed of a titanium/titanium nitride alloy (Ti/TiN) layer. The first source/drain region 15 may be formed on the first barrier layer 14. The active pillar 17 may be disposed between the first and second source/drain regions 15 and 20. The active pillar 17 may be a single crystalline semiconductor pattern in the shape of a pillar. The gate electrode 19 may cover a sidewall of the active pillar 17. The gate dielectric layer 18 may be interposed between the gate electrode 19 and the active pillar 17.

The gate electrode 19 may be formed of a metal layer, a metal silicide layer, a semiconductor layer or a combination thereof. The gate dielectric layer 18 may be formed of a silicon oxide layer, a silicon nitride layer, a silicon oxynitride layer, a high-K dielectric layer or a combination thereof.

A second barrier layer 22, a landing pad 25 and an upper insulating layer 26 may be disposed on the second source/drain region 20. The upper insulating layer 26 may cover the interlayer insulating layer 16. The landing pad 25 may penetrate the upper insulating layer 26 to be in contact with the second barrier layer 22. The second barrier layer 22 may be interposed between the landing pad 25 and the second source/drain region 20. Top surfaces of the upper insulating layer 26 and the landing pad 25 may be exposed on the same planar surface.

The landing pad 25 may be formed of a titanium (Ti) layer, a titanium nitride (TiN) layer, a tungsten (W) layer, a tungsten nitride (WN) layer, a tantalum (Ta) layer, a tantalum nitride (TaN) layer, a titanium aluminum nitride (TiAlN) layer, a titanium silicon nitride (TiSiN) layer, a tantalum aluminum nitride (TaAlN) layer, a tantalum silicon nitride (TaSiN) layer, a ruthenium (Ru) layer, an iridium (Ir) layer, a platinum (Pt) layer or a combination thereof. The second barrier layer 22 may be formed of a Ti/TiN layer. The upper insulating layer 26 may be formed of a silicon oxide layer, a silicon nitride layer, a silicon oxynitride layer, a low-K dielectric layer or a combination thereof.

As described above, a plurality of transistors may be provided on the substrate 11. Also, a plurality of landing pads 25 may be provided on the substrate 11. The landing pads 25 and the upper insulating layer 26 may be covered with an etch stop layer 27. Lower electrodes (or first and second electrodes) 43 may be formed on the landing pads 25. Support structures 33S and 41 may be provided between the lower electrodes 43. The lower electrodes 43 and the support structures 33S and 41 may be covered with an upper electrode (or third electrode) 53. A capacitor dielectric layer 51 may be interposed between the lower and upper electrodes 43 and 53. The capacitor dielectric layer 51 may be elongated between the support structures 33S and 41 and the upper electrode 53. The lower electrodes 43, the capacitor dielectric layer 51 and the upper electrode 53 may constitute capacitors. The capacitors may be electrically connected to the transistors.

Each of the lower electrodes 43 may penetrate the etch stop layer 27 to be in contact with the corresponding one of the landing pads 25. Each of the lower electrodes 43 may be in the shape of a pillar whose vertical length is greater than a horizontal length on the substrate 11. For example, an aspect ratio of each lower electrode 43 may be equal to or greater than 10:1 to 100:1. The lower electrodes 43 may be formed of a metal layer such as a ruthenium (Ru) layer, a ruthenium oxide (RuO) layer, a platinum (Pt) layer, a platinum oxide (PtO) layer, an iridium (Ir) layer, an iridium oxide (IrO) layer, an strontium ruthenium oxide (SRO(SrRuO)) layer, a barium strontium ruthenium oxide (BSRO((Ba,Sr)RuO)) layer, a calcium ruthenium oxide (CRO(CaRuO)) layer, a titanium (Ti) layer, a titanium nitride (TiN) layer, a tungsten (W) layer, a tungsten nitride (WN) layer, a tantalum (Ta) layer, a tantalum nitride (TaN) layer, a titanium aluminum nitride (TiAlN) layer, a titanium silicon nitride (TiSiN) layer, a tantalum aluminum nitride (TaAlN) layer, a tantalum silicon nitride (TaSiN) layer, or a combination thereof. In the example embodiment, the lower electrodes 43 may be formed of a Ru layer, a RuO layer or a combination thereof.

The thickness of the support structure 33S and 41 may be smaller than the vertical length of each lower electrode 43. The support structure 33S and 41 may be adjacent to top ends of the lower electrodes 43. That is, the distance between the support structure 33S and 41 and lower ends of the lower electrodes 43 may be greater than that between the support structure 33S and 41 and upper ends of the lower electrodes 43. The support structure 33S and 41 may include a supporter 33S and a glue layer 41. The supporter 33S and the glue layer 41 may be formed of different materials. The support structures 33S and 41 may function to prevent or reduce the lower electrodes 43 from moving downward. The glue layer 41 may be interposed between the lower electrodes 43 and the supporter 33S. The glue layer 41 may be in contact with the lower electrodes 43 and the supporter 33S.

The capacitor dielectric layer 51 may uniformly cover surfaces of the lower electrodes 43 and the support structure 33S and 41. The capacitor dielectric layer 51 may be formed of a tantalum oxide (TaO) layer, a tantalum oxynitride (TaON) layer, an aluminum oxide (AlO) layer, a hafnium oxide (HfO) layer, a zirconium oxide (ZrO) layer, a titanium oxide (TiO) layer, a barium strontium titanium oxide (BST((Ba,Sr)TiO)) layer, a strontium titanium oxide STO(SrTiO) layer, a barium titanium oxide BTO(BaTiO) layer, a lead zirconium titanate (PZT(Pb(Zr,Ti)O)) layer, a lead lanthanum zirconium titanium oxide ((Pb,La)(Zr,Ti)O) layer, a barium zirconium titanate Ba(Zr,Ti)O layer, a strontium zirconium titanium oxide (Sr(Zr,Ti)O) layer or a combination thereof. The upper electrode 53 may cover the lower electrodes 43, and may completely fill the spaces between the lower electrodes 43. The upper electrode 53 may be formed of a metal layer such as a ruthenium (Ru) layer, a ruthenium oxide (RuO) layer, a platinum (Pt) layer, a platinum oxide (PtO) layer, an iridium (Ir) layer, an iridium oxide (IrO) layer, an strontium ruthenium oxide (SRO(SrRuO)) layer, a barium strontium ruthenium oxide (BSRO((Ba,Sr)RuO)) layer, a calcium ruthenium oxide (CRO(CaRuO)) layer, a titanium (Ti) layer, a titanium nitride (TiN) layer, a tungsten (W) layer, a tungsten nitride (WN) layer, a tantalum (Ta) layer, a tantalum nitride (TaN) layer, a titanium aluminum nitride (TiAlN) layer, a titanium silicon nitride (TiSiN) layer, a tantalum aluminum nitride (TaAlN) layer, a tantalum silicon nitride (TaSiN) layer, or a combination thereof.

Figure 2:
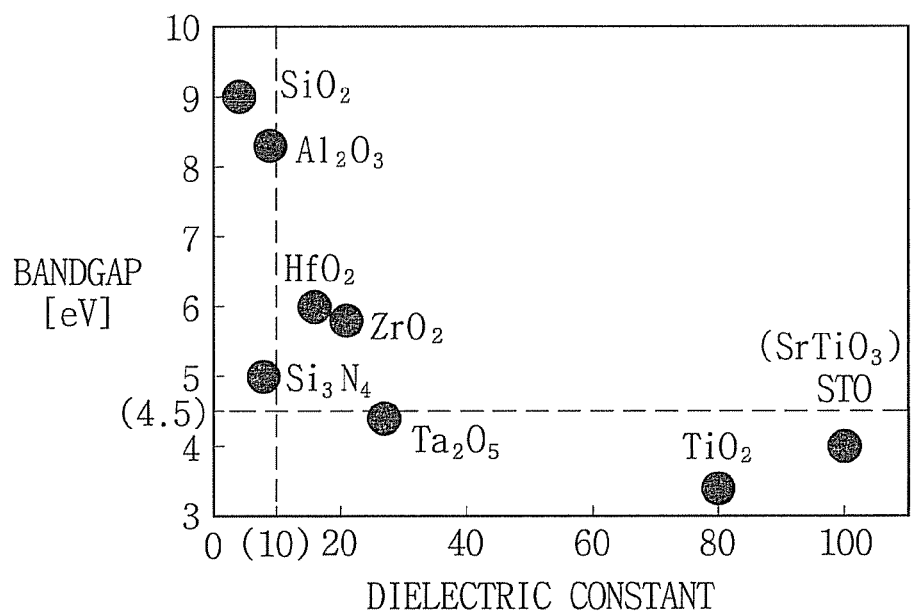
FIG. 2 is a graph illustrating dielectric constants and band gaps of various material layers according to the first example embodiment of the inventive concepts.

FIG. 2 is a graph illustrating dielectric constants and band gaps of various material layers. The dielectric constant is plotted on a horizontal axis of FIG. 2, and the unit is a constant. The band gap energy is plotted on a vertical axis of FIG. 2, and the unit is eV.

Referring to FIG. 2, the supporter 33S may be formed of a material layer exhibiting desirable insulating characteristics capable of preventing or reducing leakage current between the lower electrodes 43. The supporter 33S may be formed of a material layer having a band gap energy of at least 4.5 eV and a dielectric constant of 10 or smaller. For example, the supporter 33S may be formed of a silicon nitride (SiN) layer, a silicon carbon nitride (SiCN) layer, a silicon oxynitride (SiON) layer or a combination thereof.

The glue layer 41 may be formed of a material layer exhibiting improved bonding characteristics to the lower electrodes 43 and the supporter 33S. For example, the glue layer 41 may be formed of a tantalum oxide (TaO) layer, a titanium oxide (TiO) layer or a combination thereof. The experimental results confirmed that when the lower electrodes 43 are formed of a Ru layer, and the glue layer 41 is formed of a TaO layer, improved bonding characteristics are exhibited between the lower electrodes 43 and the glue layer 41.

Figure 3:
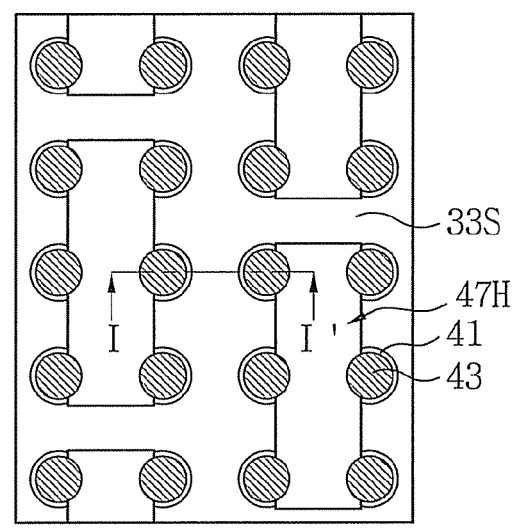
FIG. 3 is a layout diagram of a main constitution of FIG. 1

FIG. 3 is a layout diagram of a main constitution of FIG. 1. Referring to FIG. 3, the lower electrodes 43 may be arranged at predetermined or given intervals in columns and rows. The support structure 33S and 41 may include an opening 47H. The supporter 33S may be provided between the lower electrodes 43. The glue layer 41 may be interposed between the supporter 33S and the lower electrodes 43.

Figure 4:
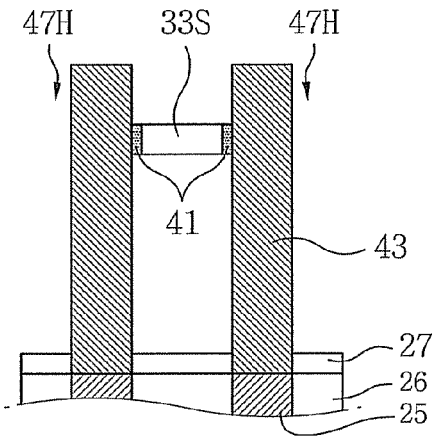
FIG. 4 is a partial cross-sectional view taken along line I-I' of FIG. 3, illustrating the main constitution of FIG. 1.

FIG. 4 is a partial cross-sectional view taken along line I-I' of FIG. 3, illustrating the main constitution of FIG. 1. Referring to FIG. 4, the lower electrodes 43 in the shape of pillars may be provided on the landing pads 25. The landing pads 25 may penetrate the upper insulating layer 26. The landing pads 25 and the upper insulating layer 26 may be covered with an etch stop layer 27. The support structure 33S and 41 may be disposed between the lower electrodes 43. The opening 47H may penetrate the support structure 33S and 41. The glue layer 41 may function to improve bonding characteristics between the supporter 33S and the lower electrodes 43.

Figure 5:
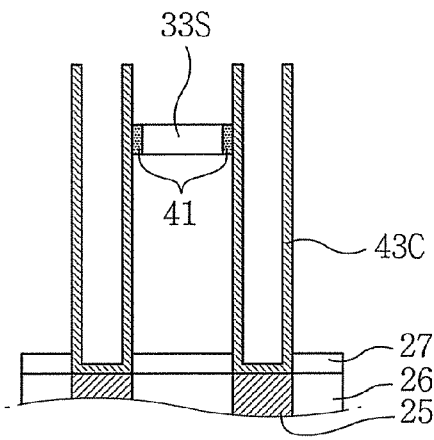
FIGS. 5 and 6 are partial cross-sectional views of a modified example embodiment of FIG. 1.

FIG. 5 is a partial cross-sectional view of a modified embodiment of FIG. 1. Referring to FIG. 5, lower electrodes 43C in the shape of cylinders may be provided on the landing pads 25. The support structure 33S and 41 may be disposed between the lower electrodes 43C.

Figure 6:
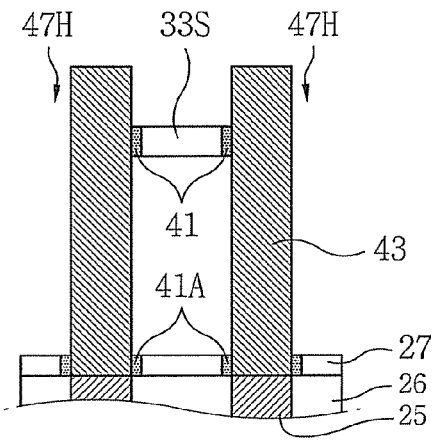

Referring to FIG. 6, an etch stop layer 27, auxiliary glue layers 41A and the lower electrodes 43 may be provided on the upper insulating layer 26 and the landing pads 25. The lower electrodes 43 may penetrate the etch stop layer 27 to be in contact with the landing pads 25. The auxiliary glue layers 41A may be interposed between the lower electrodes 43 and the etch stop layer 27. The auxiliary glue layers 41A may be formed of a TaO layer, a TiO layer or a combination thereof. The auxiliary glue layers 41A may be formed of the same material layer as the glue layer 41 simultaneously formed therewith.

The support structure 33S and 41 may be disposed to be adjacent to an upper portion of the lower electrodes 43. The support structure 33S and 41 may be disposed to be separated from the auxiliary glue layers 41A and the etch stop layer 27.

Second Embodiment

Figure 7:
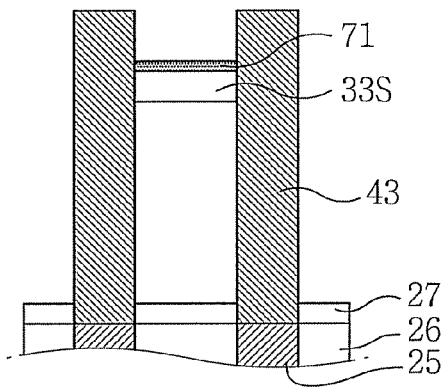
FIGS. 7 to 13 are cross-sectional views of a semiconductor device according to a second example embodiment of the inventive concepts.

A semiconductor device according to a second example embodiment will be described with reference to FIGS. 7 to 13. Referring to FIG. 7, lower electrodes 43 in the shape of pillars may be provided on landing pads 25. The landing pads 25 may penetrate the upper insulating layer 26. The landing pads 25 and the upper insulating layer 26 may be covered with an etch stop layer 27. A support structure 33S and 71 may be disposed between the lower electrodes 43. The support structure 33S and 71 may include a supporter 33S and an upper glue layer 71. The supporter 33S may be in contact with the lower electrodes 43. The upper glue layer 71 may be provided on the supporter 33S.

The upper glue layer 71 may be connected between the lower electrodes 43. In this case, one end of the upper glue layer 71 may be in contact with a sidewall of one selected from the lower electrodes 43, and the other end of the upper glue layer 71 may be in contact with a sidewall of the other of the lower electrodes 43. The upper glue layer 71 may be thinner than the supporter 33S. The upper glue layer 71 may exhibit improved bonding characteristics to the lower electrodes 43.

Figure 8:
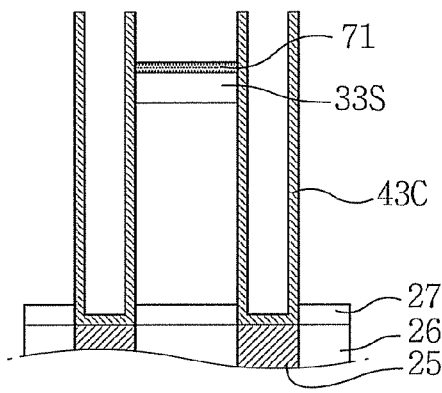

Referring to FIG. 8, lower electrodes 43C in the shape of cylinders may be provided on the landing pads 25. The support structure 33S and 71 may be disposed between the lower electrodes 43C. The support structure 33S and 71 may include a supporter 33S and an upper glue layer 71.

Figure 9:
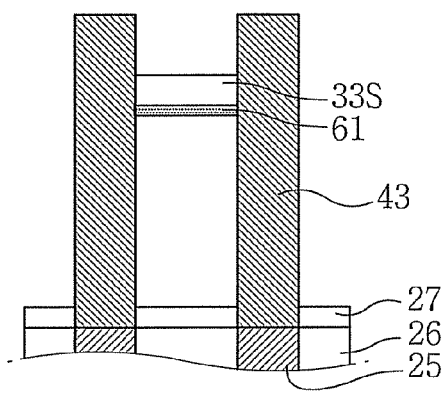

Referring to FIG. 9, lower electrodes 43 in the shape of pillars may be provided on the landing pads 25. A support structure 33S and 61 may be disposed between the lower electrodes 43. The support structure 33S and 61 may include a supporter 33S and a lower glue layer 61. The supporter 33S may be in contact with the lower electrodes 43. The lower glue layer 61 may be provided below the supporter 33S.

The lower glue layer 61 may be connected between the lower electrodes 43. In this case, one end of the lower glue layer 61 may be in contact with a sidewall of one selected from the lower electrodes 43, and the other end of the lower glue layer 61 may be in contact with a sidewall of the other of the lower electrodes 43. The lower glue layer 61 may be thinner than the supporter 33S. The lower glue layer 61 may exhibit improved bonding characteristics to the lower electrodes 43.

Figure 10:
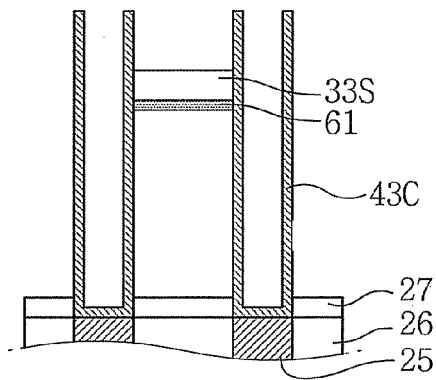

Referring to FIG. 10, lower electrodes 43C in the shape of cylinders may be provided on the landing pads 25. The support structure 33S and 61 may be disposed between the lower electrodes 43C. The support structure 33S and 61 may include a supporter 33S and a lower glue layer 61.

Figure 11:
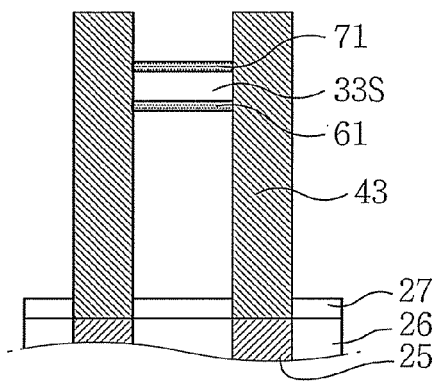

Referring to FIG. 11, lower electrodes 43 in the shape of pillars may be provided on the landing pads 25. A support structure 33S, 61 and 71 may be disposed between the lower electrodes 43. The support structure 33S, 61 and 71 may include a supporter 33S, and lower and upper glue layers 61 and 71. The supporter 33S may be in contact with the lower electrodes 43. The lower glue layer 61 may be provided below the supporter 33S. The upper glue layer 71 may be provided on the supporter 33S.

Figure 12:
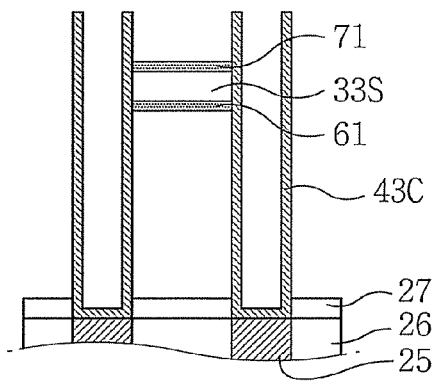

Referring to FIG. 12, lower electrodes 43C in the shape of cylinders may be provided on the landing pads 25. The support structure 33S, 61 and 71 may be disposed between the lower electrodes 43C. The support structure 33S, 61 and 71 may include a supporter 33S, and lower and upper glue layers 61 and 71.

Figure 13:
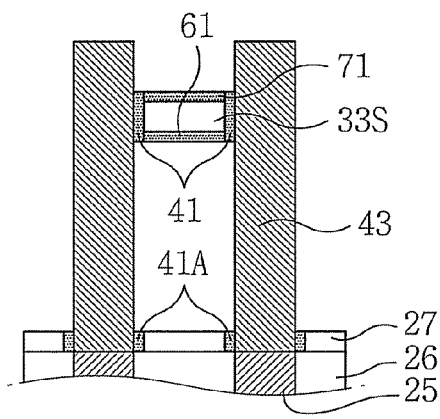

Referring to FIG. 13, an etch stop layer 27, auxiliary glue layers 41A and the lower electrodes 43 may be provided on the upper insulating layer 26 and the landing pads 25. The lower electrodes 43 may penetrate the etch stop layer 27 to be in contact with the landing pads 25. The auxiliary glue layers 41A may be interposed between the lower electrodes 43 and the etch stop layer 27.

A support structure 33S, 41, 61 and 71 may be disposed between the lower electrodes 43. The support structure 33S, 41, 61 and 71 may include a supporter 33S, a glue layer 41, and lower and upper glue layers 61 and 71. The glue layer 41 may be interposed between the supporter 33S and the lower electrodes 43. The glue layer 41 may be in contact with the supporter 33S, the lower and upper glue layers 61 and 71, and the lower electrodes 43.

The auxiliary glue layers 41A may be formed of a TaO layer, a TiO layer or a combination thereof. The auxiliary glue layers 41A may be formed of the same material layer as the glue layer 41 simultaneously formed therewith.

Third Embodiment

Figure 14:
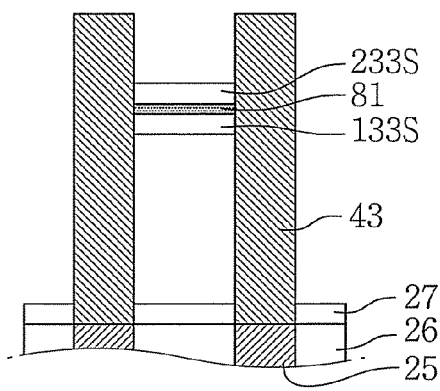
FIGS. 14 to 18 are cross-sectional views of a semiconductor device according to a third example embodiment of the inventive concepts.

A semiconductor device according to a third example embodiment will be described with reference to FIGS. 14 to 18. Referring to FIG. 14, lower electrodes 43 in the shape of pillars may be provided on the landing pads 25. The landing pads 25 may penetrate the upper insulating layer 26. The landing pads 25 and the upper insulating layer 26 may be covered with an etch stop layer 27. A support structure 133S, 233S and 81 may be disposed between the lower electrodes 43. The support structure 133S, 233S and 81 may include lower and upper supporters 133S and 233S, and a glue layer 81. The glue layer 81 may be disposed between the lower and upper supporters 133S and 233S. The upper supporter 233S may be disposed on the glue layer 81, and the lower supporter 133S may be disposed below the glue layer 81.

Figure 15:
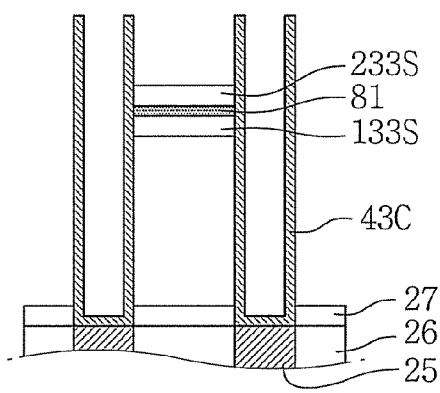

Referring to FIG. 15, lower electrodes 43C in the shape of cylinders may be provided on the landing pads 25. The support structure 133S, 233S and 81 may be disposed between the lower electrodes 43C. The support structure 133S, 233S and 81 may include lower and upper supporters 133S and 233S, and a glue layer 81.

Figure 16:
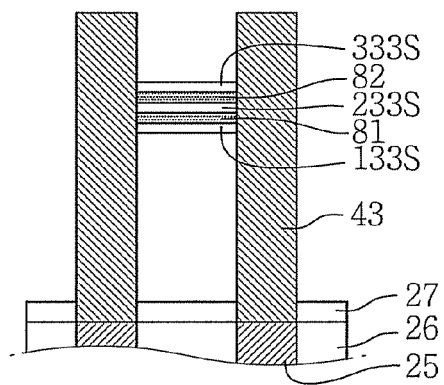

Referring to FIG. 16, lower electrodes 43 in the shape of pillars may be provided on the landing pads 25. A support structure 133S, 233S, 333S, 81 and 82 may be disposed between the lower electrodes 43. The support structure 133S, 233S, 333S, 81 and 82 may include first, second and third supporters 133S, 233S and 333S, and first and second glue layers 81 and 82. The first supporter 133S, the first glue layer 81, the second supporter 233S, the second glue layer 82 and the third supporter 333S may be sequentially stacked. That is, the support structure 133S, 233S, 333S, 81 and 82 may include a structure in which a plurality of supporters 133S, 233S and 333S and a plurality of glue layers 81 and 82 are alternately and repeatedly stacked.

Figure 17:
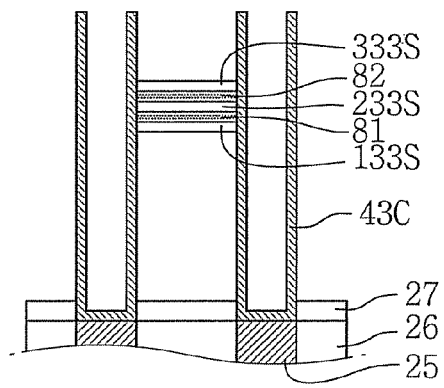

Referring to FIG. 17, lower electrodes 43C in the shape of cylinders may be provided on the landing pads 25. The support structure 133S, 233S, 333S, 81 and 82 may be disposed between the lower electrodes 43C. The support structure 133S, 233S, 333S, 81 and 82 may include a structure in which a plurality of supporters 133S, 233S and 333S and a plurality of glue layers 81 and 82 are alternately and repeatedly stacked.

Figure 18:
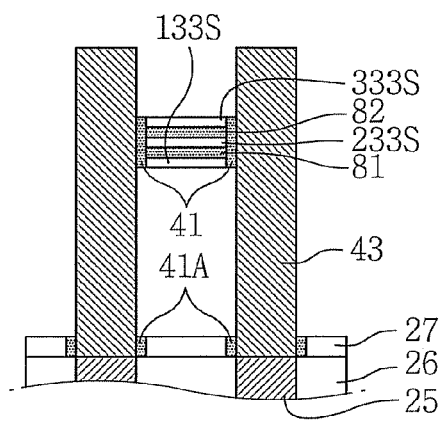

Referring to FIG. 18, an etch stop layer 27, auxiliary glue layers 41A and the lower electrodes 43 may be provided on the upper insulating layer 26 and the landing pads 25. The lower electrodes 43 may penetrate the etch stop layer 27 to be in contact with the landing pads 25. The auxiliary glue layers 41A may be interposed between the lower electrodes 43 and the etch stop layer 27.

A support structure 133S, 233S, 333S, 41, 81 and 82 may be disposed between the lower electrodes 43. The support structure 133S, 233S, 333S, 41, 81 and 82 may include a structure in which a plurality of supporters 133S, 233S and 333S and a plurality of glue layers 81 and 82 are alternately and repeatedly stacked. Further, the support structure 133S, 233S, 333S, 41, 81 and 82 may include a glue layer 41 interposed between the supporters 133S, 233S and 333S and the lower electrodes 43. The glue layer 41 may be in contact with the supporters 133S, 233S and 333S, first and second glue layers 81 and 82, and the lower electrodes 43.

Fourth Embodiment

Figure 19:
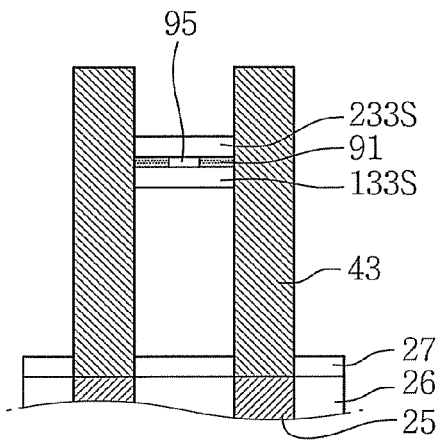
FIGS. 19 to 25 are cross-sectional views of a semiconductor device according to a fourth example embodiment of the inventive concepts.

A semiconductor device according to a fourth example embodiment will be described with reference to FIGS. 19 to 25. Referring to FIG. 19, lower electrodes 43 in the shape of pillars may be provided on landing pads 25. The landing pads 25 may penetrate the upper insulating layer 26. The landing pads 25 and the upper insulating layer 26 may be covered with an etch stop layer 27. A support structure 133S, 233S, 91 and 95 may be disposed between the lower electrodes 43. The support structure 133S, 233S, 91, and 95 may include lower and upper supporters 133S and 233S, a glue layer 91 and an intermediate insulating layer 95. The glue layer 91 and the intermediate insulating layer 95 may be disposed between the lower and upper supporters 133S and 233S. The glue layer 91 may be divided by the intermediate insulating layer 95. The glue layer 91 may be disposed between the intermediate insulating layer 95 and the lower electrodes 43.

The intermediate insulating layer 95 may be formed of a material layer having an etch selectivity with respect to the lower and upper supporters 133S and 233S. The intermediate insulating layer 95 may be formed of a material layer having a band gap energy of at least 4.5 eV and a dielectric constant of 10 of smaller. For example, the intermediate insulating layer 95 may be formed of a silicon oxide layer. The intermediate insulating layer 95 may function to reduce leakage current between the lower electrodes 43.

Figure 20:
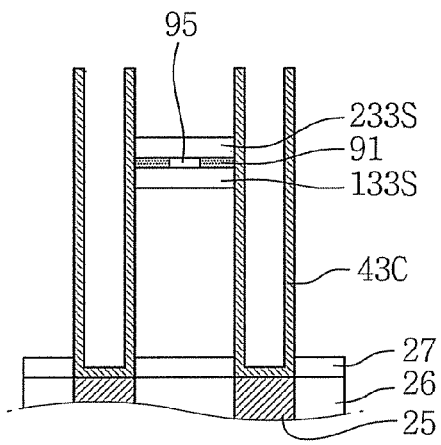

Referring to FIG. 20, lower electrodes 43C in the shape of cylinders may be provided on the landing pads 25. The support structure 133S, 233S, 91 and 95 may be disposed between the lower electrodes 43C. The support structure 133S, 233S, 91 and 95 may include lower and upper supporters 133S and 233S, a glue layer 91 and an intermediate insulating layer 95.

Figure 21:
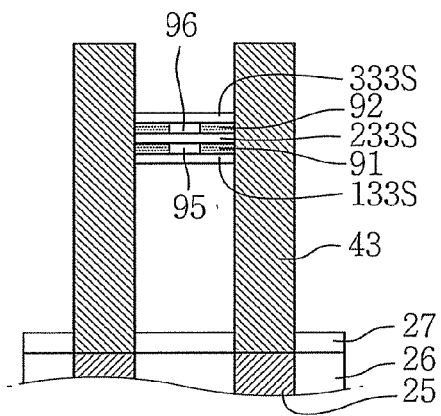

Referring to FIG. 21, lower electrodes 43 in the shape of pillars may be provided on landing pads 25. A support structure 133S, 233S, 333S, 91, 92, 95 and 96 may be disposed between the lower electrodes 43. The support structure 133S, 233S, 333S, 91, 92, 95 and 96 may include first, second and third supporters 133S, 233S and 333S, first and second glue layers 91 and 82, and first and second intermediate insulating layers 95 and 96. The support structure 133S, 233S, 333S, 91, 92, 95 and 96 may include a structure in which a plurality of supporters 133S, 233S and 333S, a plurality of glue layers 81 and 82, and a plurality of intermediate insulating layers 95 and 96 are alternately and repeatedly stacked.

Figure 22:
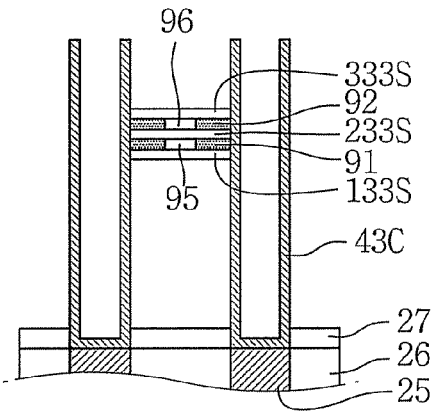

Referring to FIG. 22, lower electrodes 43C in the shape of cylinders may be provided on the landing pads 25. The support structure 133S, 233S, 333S, 91, 92, 95 and 96 may be disposed between the lower electrodes 43C. The support structure 133S, 233S, 333S, 91, 92, 95 and 96 may include a structure in which a plurality of supporters 133S, 233S and 333S, a plurality of glue layers 91 and 92 and a plurality of intermediate insulating layers 95 and 96 are alternately and repeatedly stacked.

Figure 23:
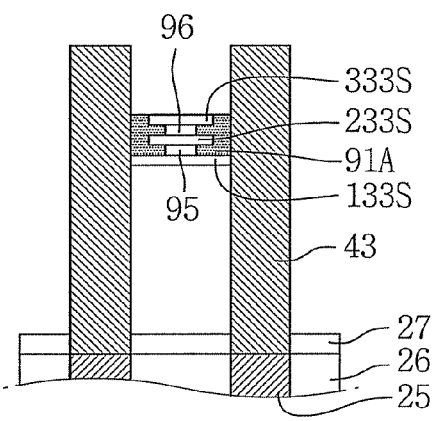

Referring to FIG. 23, lower electrodes 43 in the shape of pillars may be provided on the landing pads 25. A support structure 133S, 233S, 333S, 91A, 95 and 96 may be disposed between the lower electrodes 43. The support structure 133S, 233S, 333S, 91A, 95 and 96 may include first, second and third supporters 133S, 233S and 333S, a glue layer 91A, and first and second intermediate insulating layers 95 and 96. In this case, a plurality of supporters 133S, 233S and 333S and a plurality of intermediate insulating layers 95 and 96 are alternately and repeatedly stacked.

The glue layer 91A may be buried between the first and second supporters 133S and 233S and the first intermediate insulating layer 95, and may be buried between the second and third supporters 233S and 333S and the second intermediate insulating layer 96. Further, the glue layer 91A may be elongated between the lower electrodes 43 and the third supporter 333S, and may be elongated between the lower electrodes 43 and the second supporter 233S.

Figure 24:
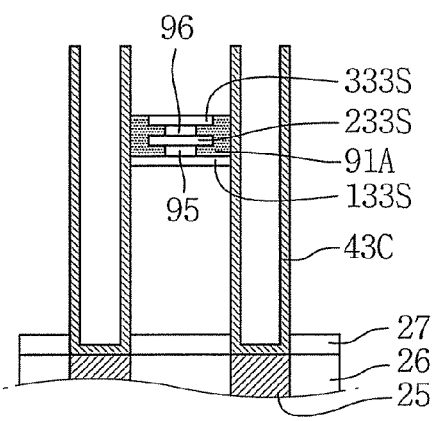

Referring to FIG. 24, lower electrodes 43C in the shape of cylinders may be provided on the landing pads 25. The support structure 133S, 233S, 333S, 91A, 95 and 96 may be disposed between the lower electrodes 43C. The support structure 133S, 233S, 333S, 91A, 95 and 96 may include first, second and third supporters 133S, 233S and 333S, a glue layer 91A, and first and second intermediate insulating layers 95 and 96.

Figure 25:
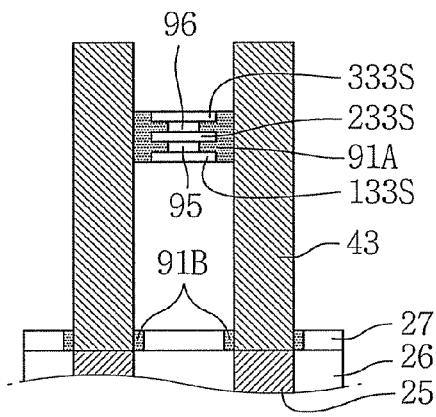

Referring to FIG. 25, an etch stop layer 27, auxiliary glue layers 91B and the lower electrodes 43 may be provided on the upper insulating layer 26 and the landing pads 25. The lower electrodes 43 may penetrate the etch stop layer 27 to be in contact with the landing pads 25. The auxiliary glue layers 91B may be interposed between the lower electrodes 43 and the etch stop layer 27.

A support structure 133S, 233S, 333S, 91A, 95 and 96 may be disposed between the lower electrodes 43. The support structure 133S, 233S, 333S, 91A, 95 and 96 may include first, second and third supporters 133S, 233S and 333S, a glue layer 91A, and first and second intermediate insulating layers 95 and 96.

Fifth Embodiment

Figure 26:
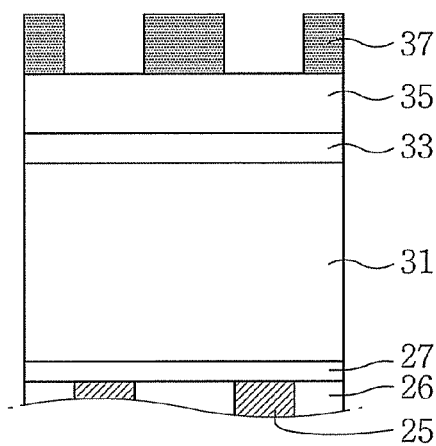
FIGS. 26 to 34 are cross-sectional views illustrating a method of fabricating a semiconductor device according to a fifth example embodiment of the inventive concepts.

A semiconductor device according to a fifth example embodiment will be described with reference to FIGS. 3, 4, 6, and 26 to 34. Referring to FIG. 26, an etch stop layer 27 may be formed on landing pads 25 and an upper insulating layer 26. A first molding layer 31, a supporter layer 33 and a second molding layer 35 may be sequentially formed on the etch stop layer 27. A first mask pattern 37 may be formed on the second molding layer 35.

The landing pads 25 and the upper insulating layer 26 may be provided on the substrate (11 of FIG. 1). The landing pads 25 may be formed to be separated from each other in columns and rows. While switching devices similar to those described with reference to FIG. 1 may be formed on the substrate (11 of FIG. 1), the description thereof will be omitted for clarity. The landing pads 25 may be electrically connected to the switching devices. The landing pads 25 and the upper insulating layer 26 may have planar top surfaces Using a planarization process. The etch stop layer 27 may cover the entire surface of the substrate (11 of FIG. 1). The first molding layer 31 may cover the entire surface of the etch stop layer 27. The supporter layer 33 may cover the entire surface of the first molding layer 31. The second molding layer 35 may cover the entire surface of the supporter layer 33.

The supporter layer 33 may be formed of a material layer having an etch selectivity with respect to the first and second molding layers 31 and 35. The supporter layer 33 may be formed of a material layer having a band gap energy of at least 4.5 eV and a dielectric constant of 10 or smaller. The supporter layer 33 may be formed of a SiN layer, a SiCN layer, a SiON layer or a combination thereof. For example, the supporter layer 33 may be formed of a SiN layer.

The etch stop layer 27 may be formed of an insulating layer having an etch selectivity with respect to the first molding layer 31. For example, the etch stop layer 27 may be formed of a nitride layer such as a SiN layer. The first molding layer 31 may be formed of a P-TEOS layer, a BPSG layer, a HDP layer or a combination thereof. For example, the first molding layer 31 may be formed of a silicon oxide layer. The second molding layer 35 may be formed of a material layer having an etch selectivity with respect to the supporter layer 33 and the first molding layer 31. For example, the second molding layer 35 may be formed of a polysilicon layer. In some embodiments, the second molding layer 35 may be formed of the same material layer as the first molding layer 31.

Figure 27:
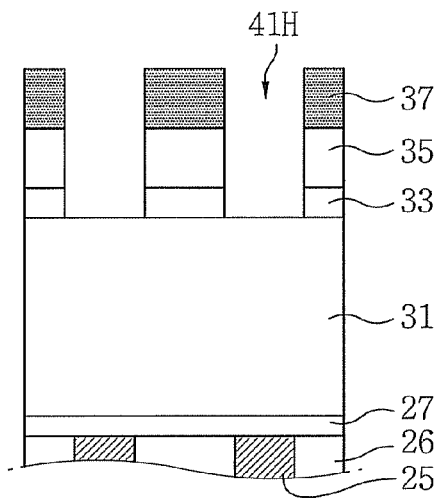
Figure 28:
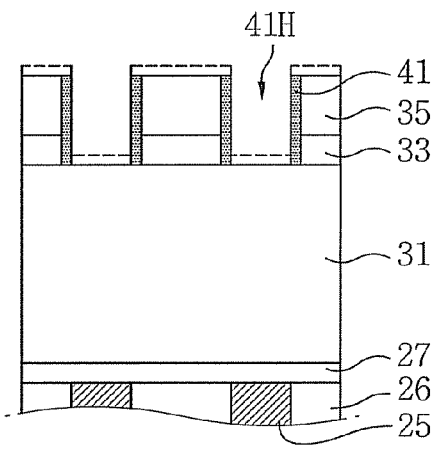

Referring to FIGS. 27 and 28, the first mask pattern 37 may be used as an etch mask to form first openings 41H penetrating the second molding layer 35 and the supporter layer 33. Sidewalls of the second molding layer 35 and the supporter layer 33 may be exposed through the first openings 41H. Afterwards, the first mask pattern 37 may be removed. Then, a glue layer 41 may be formed on the sidewalls of the second molding layer 35 and the supporter layer 33. The glue layer 41 may be formed using a thin film formation process and an anisotropic etching process. As a result, a top surface of the second molding layer 35 may be exposed, and the first molding layer 31 may be exposed to bottoms of the first openings 41H.

The glue layer 41 may be formed of a different material layer from the supporter layer 33. The glue layer 41 may be formed of a material layer having an etch selectivity with respect to the first and second molding layers 31 and 35. For example, the glue layer 41 may be formed of a TaO layer, a TiO layer or a combination thereof. In some example embodiments, the first mask pattern 37 may be removed after the glue layer 41 is formed.

Figure 29:
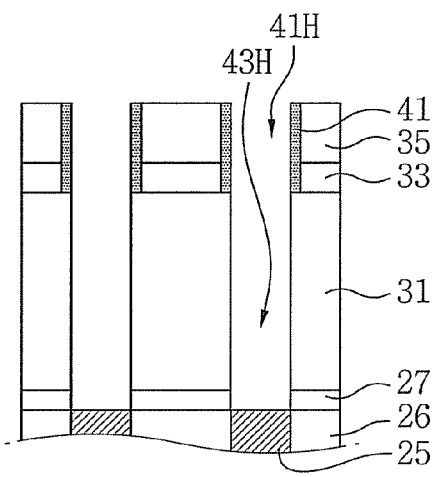

Referring to FIG. 29, the second molding layer 35 may be used as a mask pattern to form second openings 43H penetrating the first molding layer 31 and the etch stop layer 27. The first and second openings 41H and 43H may constitute lower electrode holes. The lower electrode holes may be arranged on the landing pads 25. The glue layer 41 may be kept on the sidewalls of the second molding layer 35 and the supporter layer 33. The landing pads 25 may be exposed to bottoms of the second openings 43H.

Figure 30:
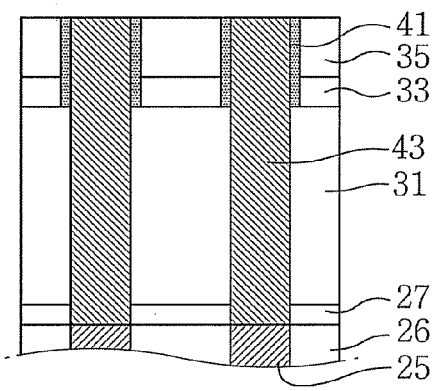

Referring to FIG. 30, lower electrodes 43 filling the first and second openings 41H and 43H may be formed. The lower electrodes 43 may be formed using a thin film formation process and a planarization process. Top surfaces of the lower electrodes 43 and the second molding layer 35 may be exposed on substantially the same planar surface. The lower electrodes 43 may be in contact with the landing pads 25. The glue layer 41 may remain between the lower electrodes 43 and the supporter layer 33, and kept between the lower electrodes 43 and the second molding layer 35.

The lower electrodes 43 may be formed of a metal layer such as a Ru layer, a RuO layer, a Pt layer, a PtO layer, an Ir layer, an IrO layer, a SRO(SrRuO) layer, a BSRO((Ba,Sr)RuO) layer, a CRO(CaRuO) layer, a Ti layer, a TiN layer, a W layer, a WN layer, a Ta layer, a TaN layer, a TiAlN layer, a TiSiN layer, a TaAlN layer, a TaSiN layer and a combination thereof. For example, the lower electrodes 43 may be formed of a Ru layer, a RuO layer or a combination thereof. The glue layer 41 may be in contact with the lower electrodes 43 and the supporter layer 33. The glue layer 41 may be formed of a material layer exhibiting improved bonding characteristics to the lower electrodes 43 and the supporter layer 33.

Figure 31:
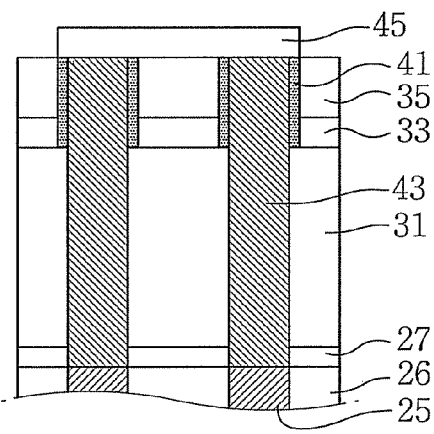
Figure 32:
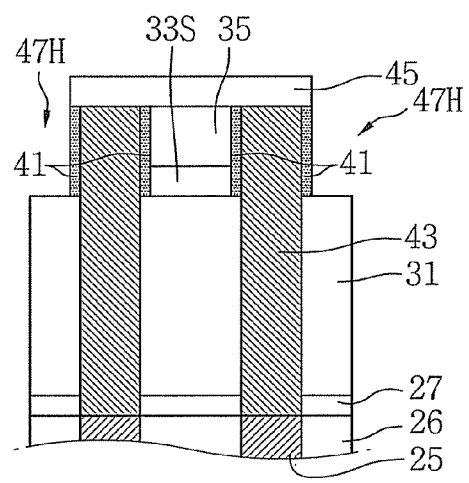

Referring to FIGS. 31 and 32, a second mask pattern 45 may be formed on the lower electrodes 43 and the second molding layer 35. The second mask pattern 45 may be used as an etch mask to form third openings 47H penetrating the second molding layer 35 and the supporter layer 33. The third openings 47H may have a similar constitution to that illustrated in FIG. 3. As a result, the supporter layer 33 may be patterned, so that a supporter 33S that is kept between the lower electrodes 43 may be formed.

Figure 33:
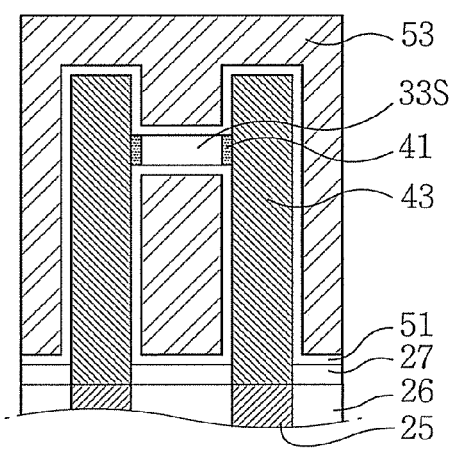

Referring to FIGS. 3, 4 and 33, the second mask pattern 45, the second molding layer 35 and the first molding layer 31 may be removed to expose the lower electrodes 43. The supporter 33S may be kept between the lower electrodes 43. The glue layer 41 may be kept between the lower electrodes 43 and the supporter 33S. The supporter 33S and the glue layer 41 may constitute a support structure 33S and 41. The support structure 33S and 41 may function to prevent or reduce the lower electrodes 43 from moving downward.

Afterwards, a capacitor dielectric layer 51 uniformly covering surfaces of the lower electrodes 43 may be formed. The capacitor dielectric layer 51 may cover upper and lower parts of the support structure 33S and 41. An upper electrode 53 may be formed on the capacitor dielectric layer 51. The upper electrode 53 may completely fill the spaces between the lower electrodes 43.

Figure 34:
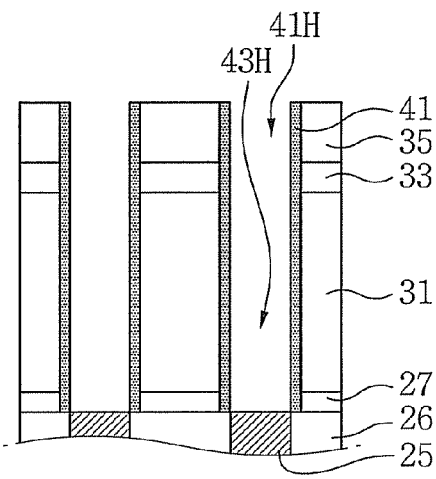

Referring to FIGS. 6 and 34, lower electrode holes 41H and 43H penetrating the second molding layer 35, the supporter layer 33, the first molding layer 31 and the etch stop layer 27 may be formed. The lower electrode holes 41H and 43H may be arranged on the landing pads 25. A glue layer 41 may be formed on sidewalls of the lower electrode holes 41H and 43H. The glue layer 41 may cover sidewalls of the second molding layer 35, the supporter layer 33, the first molding layer 31 and the etch stop layer 27. The landing pads 25 may be exposed to bottom surfaces of the lower electrode holes 41H and 43H. Afterwards, the semiconductor device including a similar constitution to that illustrated in FIG. 6 may be formed.

Sixth Embodiment

Figure 35:
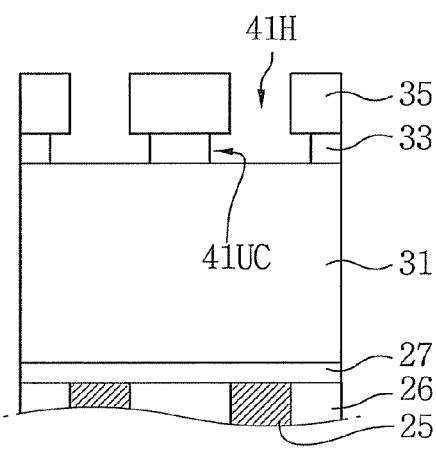
FIGS. 35 to 41 are cross-sectional views illustrating a method of fabricating a semiconductor device according to a sixth example embodiment of the inventive concepts.

A semiconductor device according to a sixth example embodiment will be described with reference to FIGS. 35 to 41. Referring to FIG. 35, an etch stop layer 27, a first molding layer 31, a supporter layer 33, a second molding layer 35 and first openings 41H may be formed on landing pads 25 and an upper insulating layer 26 using a similar method to those of FIGS. 26 and 27. Sidewalls of the second molding layer 35 and the supporter layer 33 may be exposed through the first openings 41H. Then, the first mask pattern 37 may be removed. Subsequently, an isotropic etching process may be used to partially remove the supporter layer 33, so that undercut regions 41UC may be formed below the second molding layer 35.

Figure 36:
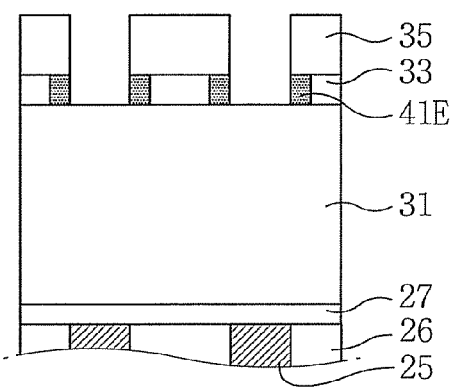

Referring to FIG. 36, a glue layer 41E may be formed in the undercut regions 41UC. The glue layer 41E may be formed using a thin film formation process and an etch back process. In this process, the glue layer 41E may be interposed between the first and second molding layers 31 and 35. Sidewalls of the second molding layer 35 and the glue layer 41E may be exposed in the first openings 41H.

Figure 37:
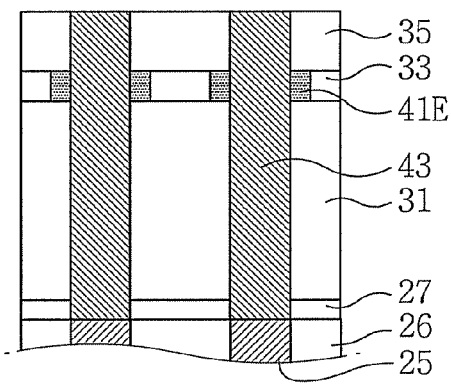
Figure 38:
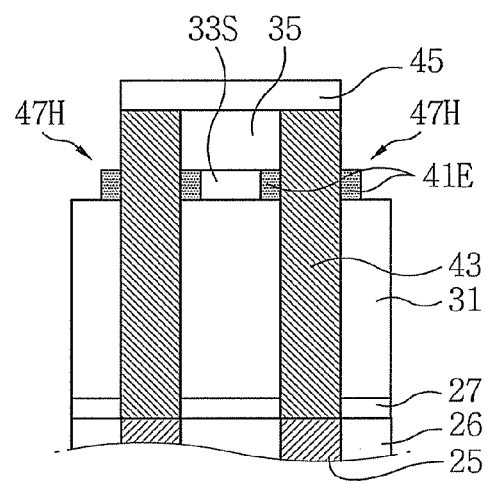

Referring to FIGS. 37 and 38, lower electrodes 43 filling the first openings 41H and penetrating the first molding layer 31 to be in contact with the landing pads 25 may be formed using a similar method to those of FIGS. 29 and 30. A second mask pattern 45 may be formed on the lower electrodes 43 and the second molding layer 35. The second mask pattern 45 may be used as an etch mask to form third openings 47H penetrating the second molding layer 35 and the supporter layer 33. As a result, the supporter layer 33 may be patterned to form a supporter 33S that is kept between the lower electrodes 43.

Figure 39:
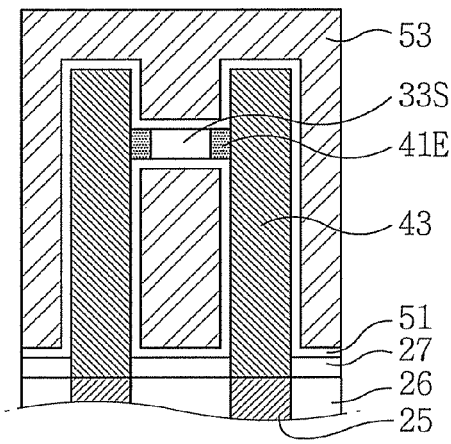

Referring to FIG. 39, the second mask pattern 45, the second molding layer 35 and the first molding layer 31 may be removed to expose the lower electrodes 43 in a similar manner to those of FIGS. 3, 4 and 33. The supporter 33S may be kept between the lower electrodes 43. The glue layer 41E may be kept between the lower electrodes 43 and the supporter 33S. The supporter 33S and the glue layer 41E may constitute a support structure 33S and 41E.

Then, a capacitor dielectric layer 51 uniformly covering surfaces of the lower electrodes 43 may be formed. The capacitor dielectric layer 51 may cover upper and lower parts of the support structure 33S and 41E. An upper electrode 53 may be formed on the capacitor dielectric layer 51.

Figure 40:
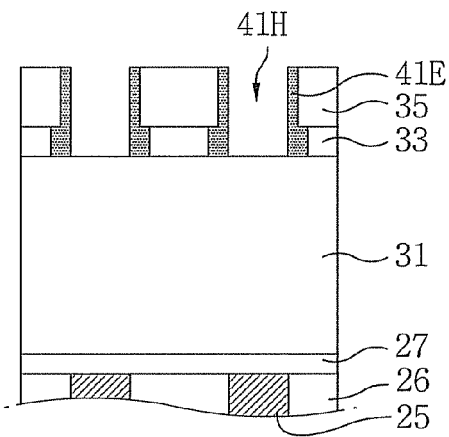

Referring to FIG. 40, the glue layer 41E may be formed using a thin film formation process and an anisotropic etching process. In this case, the glue layer 41E may fill the spaces between the first and second molding layers 31 and 35 and cover a sidewall of the second molding layer 35. Sidewalls of the glue layer 41E may be exposed in the first openings 41H.

Figure 41:
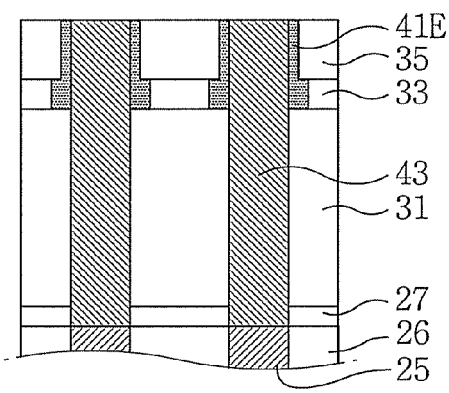

Referring to FIG. 41, lower electrodes 43 filling the first openings 41H and penetrating the first molding layer 31 to be in contact with the landing pads 25 may be formed. Then, a capacitor dielectric layer 51 and an upper electrode 53 may be formed using similar methods to those of FIGS. 38 and 39.

Seventh Embodiment

Figure 42:
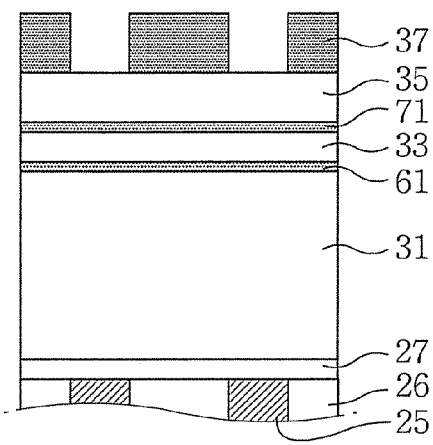
FIGS. 42 to 46 are cross-sectional views illustrating a method of fabricating a semiconductor device according to a seventh example embodiment of the inventive concepts.

A semiconductor device according to a seventh example embodiment will be described with reference to FIGS. 11, 13, and 42 to 46. Referring to FIG. 42, an etch stop layer 27 and a first molding layer 31 may be formed on landing pads 25 and an upper insulating layer 26 using a similar method to that of FIG. 26. A first glue layer 61, a supporter layer 33, a second glue layer 71 and a second molding layer 35 may be sequentially formed on the first molding layer 31. A first mask pattern 37 may be formed on the second molding layer 35.

The first glue layer 61 may cover the entire surface of the first molding layer 31. The second glue layer 71 may cover the entire surface of the supporter layer 33. The first and second glue layers 61 and 71 may be thinner than the supporter layer 33.

Figure 43:
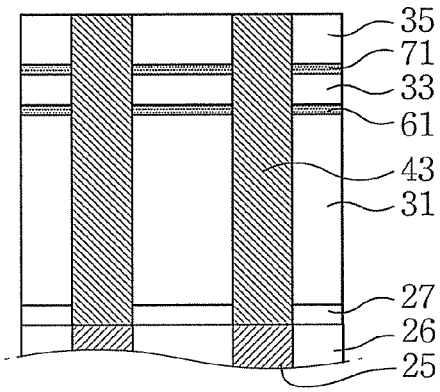

Referring to FIG. 43, lower electrodes 43 sequentially penetrating the second molding layer 35, the second glue layer 71, the supporter layer 33, the first glue layer 61, the first molding layer 31, and the etch stop layer 27 to be in contact with the landing pads 25 may be formed.

Figure 44:
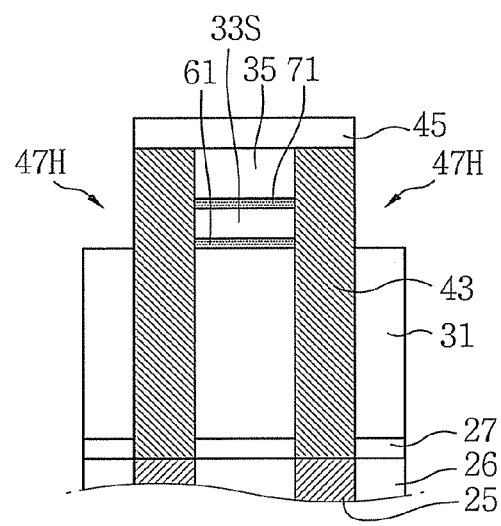

Referring to FIG. 44, a second mask pattern 45 may be formed on the lower electrodes 43 and the second molding layer 35. The second mask pattern 45 may be used as an etch mask to form third openings 47H penetrating the second molding layer 35, the second glue layer 71, the supporter layer 33 and the first glue layer 61. As a result, the supporter layer 33 may be patterned to form a supporter 33S that is kept between the lower electrodes 43. The first and second glue layers 61 and 71 may be respectively kept below and on the supporter 33S.

Figure 45:
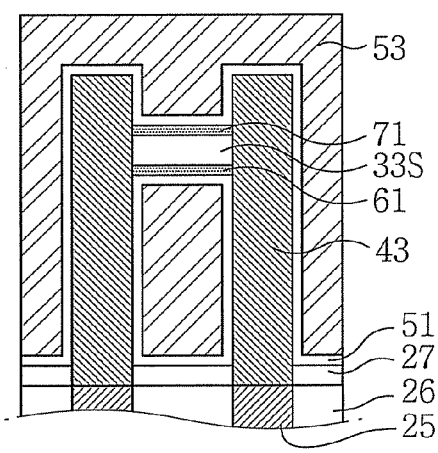

Referring to FIGS. 11 and 45, after the first and second molding layers 31 and 35 are removed, a capacitor dielectric layer 51 and an upper electrode 53 may be formed on the lower electrodes 43. The first glue layer 61, the supporter 33S and the second glue layer 71 may constitute a support structure 33S, 61 and 71. The capacitor dielectric layer 51 may cover upper and lower parts of the support structure 33S, 61 and 71. In some example embodiments, one of the first and second glue layers 61 and 71 may be omitted.

Figure 46:
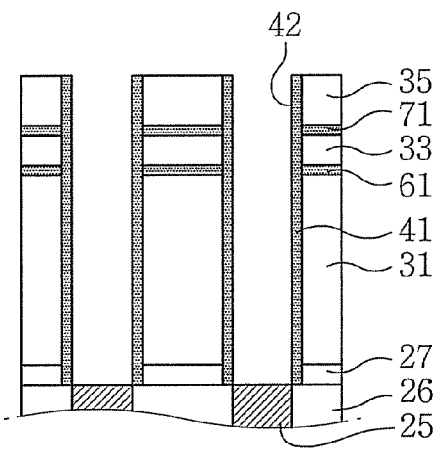

Referring to FIGS. 13 and 46, lower electrode holes 42 penetrating the second molding layer 35, the second glue layer 71, the supporter layer 33, the first glue layer 61, the first molding layer 31 and the etch stop layer 27 may be formed. The lower electrode holes 42 may be arranged on the landing pads 25. A glue layer 41 may be formed on sidewalls of the lower electrode holes 42. The glue layer 41 may cover sidewalls of the second molding layer 35, the second glue layer 71, the supporter layer 33, the first glue layer 61, the first molding layer 31 and the etch stop layer 27. The landing pads 25 may be exposed to bottoms of the lower electrode holes 42. Then, the semiconductor device including a constitution similar to that of FIG. 13 may be formed.

Eighth Embodiment

A method of fabricating a semiconductor device according to an eighth example embodiment will be described with reference to FIGS. 14, 16, 18, and 47 to 50.

Figure 47:
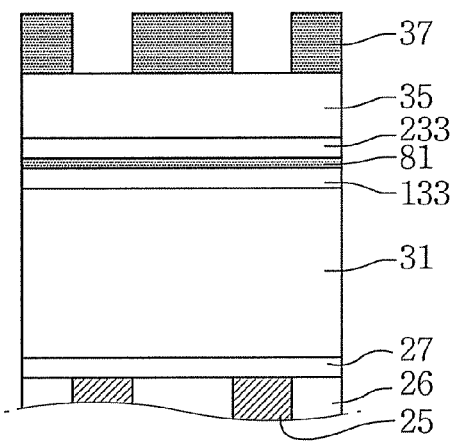
FIGS. 47 to 50 are cross-sectional views illustrating a method of fabricating a semiconductor device according to an eighth example embodiment of the inventive concepts.

Referring to FIG. 47, an etch stop layer 27 and a first molding layer 31 may be formed on landing pads 25 and an upper insulating layer 26. A lower supporter layer 133, a glue layer 81, an upper supporter layer 233 and a second molding layer 35 may be sequentially formed on the first molding layer 31. A first mask pattern 37 may be formed on the second molding layer 35.

Figure 48:
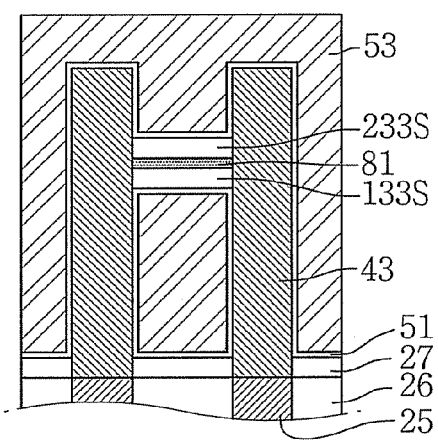

Referring to FIGS. 14 and 48, lower electrodes 43 penetrating the etch stop layer 27 to be in contact with the landing pads 25 may be formed. A capacitor dielectric layer 51 and an upper electrode 53 may be formed on the lower electrodes 43. A support structure 133S, 81 and 233S may be formed between the lower electrodes 43. The support structure 133S, 81 and 233S may include a lower supporter 133S below the glue layer 81, and an upper supporter 233S on the glue layer 81.

Figure 49:
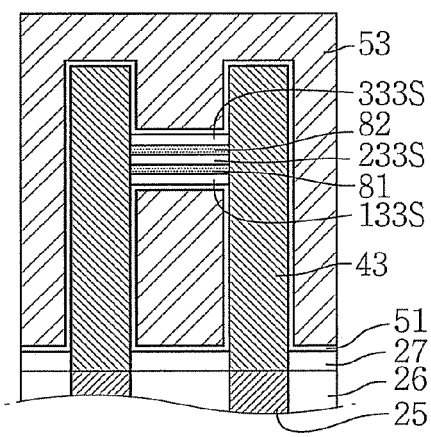

Referring to FIGS. 16 and 49, lower electrodes 43 penetrating an etch stop layer 27 to be in contact with landing pads 25 may be formed. A capacitor dielectric layer 51 and an upper electrode 53 may be formed on the lower electrodes 43. A support structure 133S, 81, 233S, 82 and 333S may be formed between the lower electrodes 43. The support structure 133S, 81, 233S, 82 and 333S may include first, second and third supporters 133S, 233S and 333S, and first and second glue layers 81 and 82.

Figure 50:
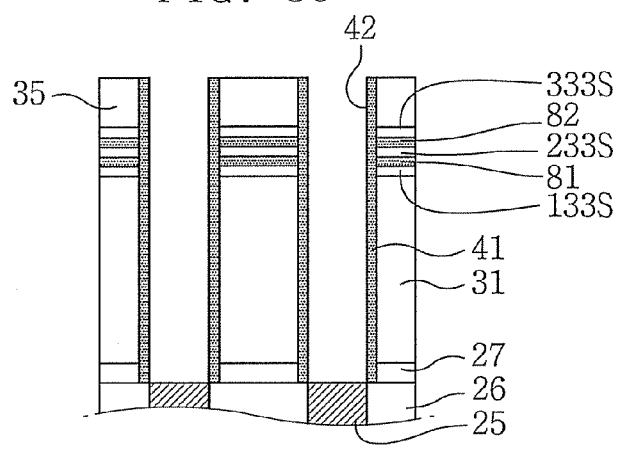

Referring FIGS. 18 and 50, lower electrode holes 42 penetrating the second molding layer 35, the third supporter 333S, the second glue layer 82, the second supporter 233S, the first glue layer 81, the first supporter 133S, the first molding layer 31 and the etch stop layer 27 may be formed. A glue layer 41 may be formed on sidewalls of the lower electrode holes 42. The glue layer 41 may cover sidewalls of the second molding layer 35, the third supporter 333S, the second glue layer 82, the second supporter 233S, the first glue layer 81, the first supporter 133S, the first molding layer 31 and the etch stop layer 27. Subsequently, the semiconductor device including a constitution similar to that of FIG. 18 may be formed.

Ninth Embodiment

Figure 51:
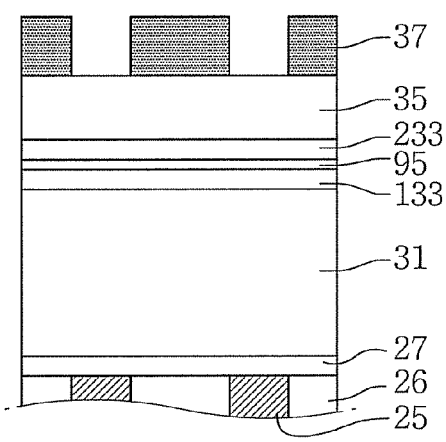
FIGS. 51 to 61 are cross-sectional views illustrating a method of fabricating a semiconductor device according to a ninth example embodiment of the inventive concepts.

A method of fabricating a semiconductor device according to a ninth example embodiment will be described with reference to FIGS. 19, 21, 23, 25, and 51 to 61. Referring to FIG. 51, an etch stop layer 27 and a first molding layer 31 may be formed on landing pads 25 and an upper insulating layer 26. A lower supporter layer 133, an intermediate insulating layer 95, an upper supporter layer 233 and a second molding layer 35 may be sequentially formed on the first molding layer 31. A first mask pattern 37 may be formed on the second molding layer 35. The intermediate insulating layer 95 may be formed of a material layer having an etch selectivity with respect to the lower and upper supporter layers 133 and 233. For example, the intermediate insulating layer 95 may be formed of a silicon oxide layer.

Figure 52:
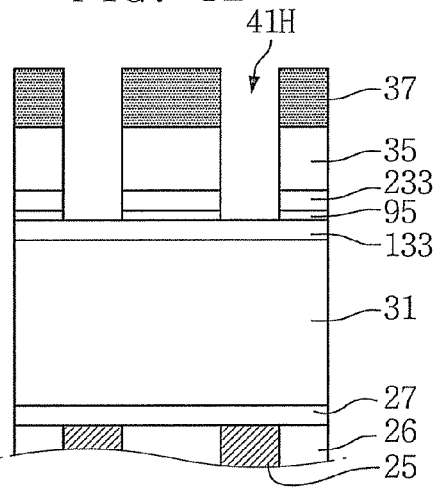
Figure 53:
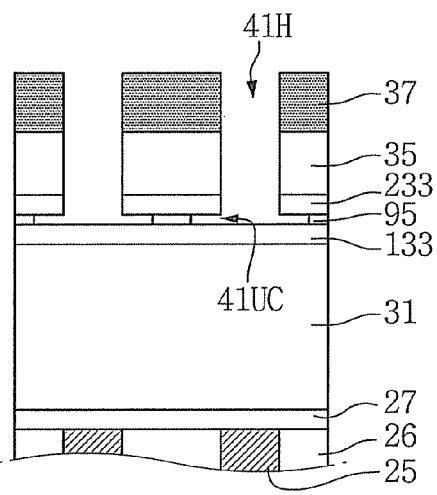

Referring to FIGS. 52 and 53, the first mask pattern 37 may be used as an etch mask to form first openings 41H penetrating the second molding layer 35, the upper supporter layer 233 and the intermediate insulating layer 95. Afterwards, an isotropic etching process may be used to form undercut regions 41UC below the upper supporter layer 233. The first mask pattern 37 may be removed.

Figure 54:
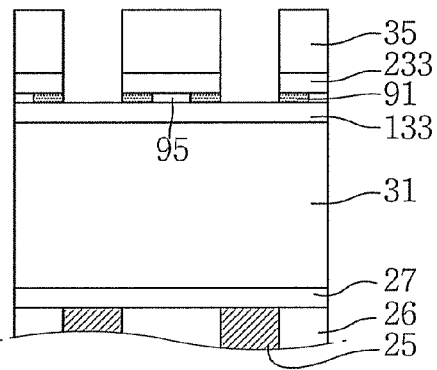
Figure 55:
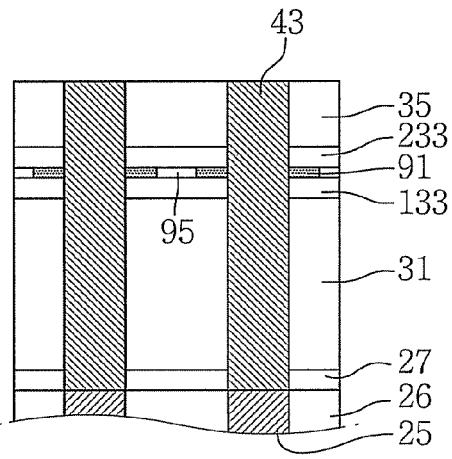

Referring to FIGS. 54 and 55, a glue layer 91 filling the undercut regions 41UC may be formed. Then, lower electrodes 43 filling the first openings 41H and penetrating the first molding layer 31 to be in contact with the landing pads 25 may be formed.

Figure 56:
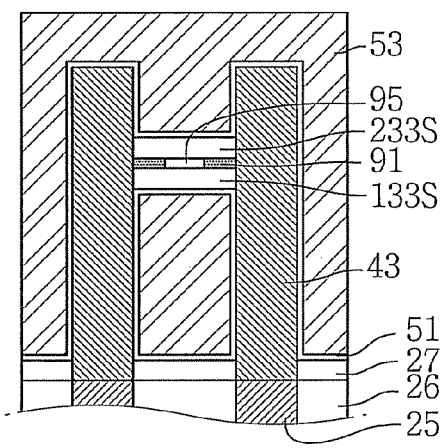

Referring to FIGS. 19 and 56, a support structure 133S, 233S, 91 and 95 may be formed between the lower electrodes 43. The support structure 133S. 233S, 91 and 95 may include lower and upper supporters 133S and 233S, a glue layer 91 and an intermediate insulating layer 95. The glue layer 91 and the intermediate insulating layer 95 may be formed between the lower and upper supporters 133S and 233S. The glue layer 91 may be divided by the intermediate insulating layer 95. The glue layer 91 may be formed between the intermediate insulating layer 95 and the lower electrodes 43. A capacitor dielectric layer 51 and an upper electrode 53 may be formed on the lower electrodes 43.

Figure 57:
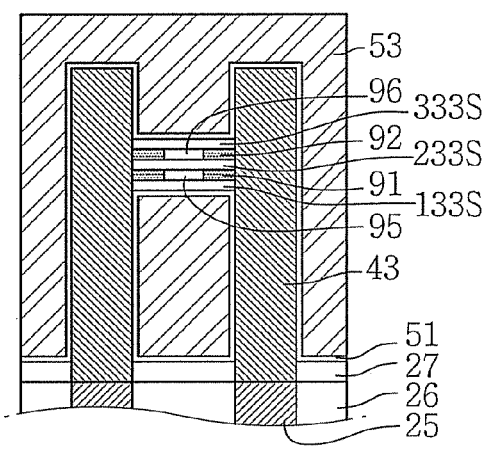

Referring to FIGS. 21 and 57, a support structure 133S, 233S, 333S, 91, 92, 95 and 96 may be formed between lower electrodes 43. The support structure 133S, 233S, 333S, 91, 92, 95 and 96 may include first, second and third supporters 133S, 233S and 333S, first and second glue layers 91 and 92, and first and second intermediate insulating layers 95 and 96. A capacitor dielectric layer 51 and an upper electrode 53 may be formed on the lower electrodes 43. The capacitor dielectric layer 51 may cover upper and lower parts of the support structure 133S, 233S, 333S, 91, 92, 95 and 96.

Figure 58:
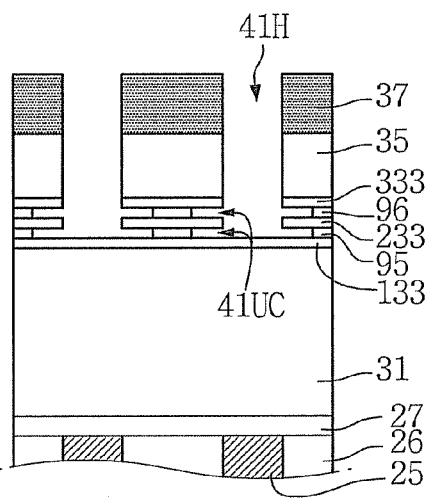

Referring to FIG. 58, an etch stop layer 27, a first molding layer 31, a first supporter layer 133, a first intermediate insulating layer 95, a second supporter layer 233, a second intermediate insulating layer 96 and a third supporter layer 333 may be sequentially formed on landing pads 25 and an upper insulating layer 26 in a similar manner to those of FIGS. 51 to 53. A first mask pattern 37 may be formed on the second molding layer 35.

The first mask pattern 37 may be used as an etch mask to form first openings 41H penetrating the second molding layer 35, the third supporter layer 333, the second intermediate insulating layer 96, the second supporter layer 233 and the first intermediate insulating layer 95. Then, an isotropic etching process may be used to form undercut regions 41UC below the third supporter layer 333 and the second supporter layer 233. The first mask pattern 37 may be removed.

Figure 59:
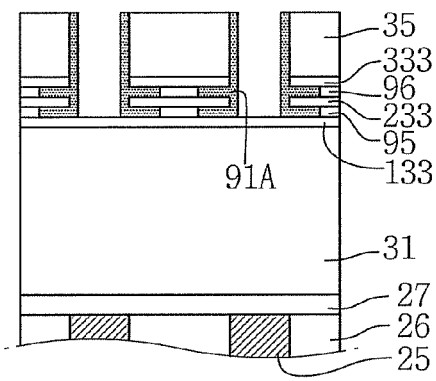

Referring to FIG. 59, a glue layer 91A filling the undercut regions 41UC and covering sidewalls of the second molding layer 35, and the second and third supporter layers 233 and 333 may be formed. The glue layer 91A may be formed using a thin film formation process and an anisotropic etching process.

Figure 60:
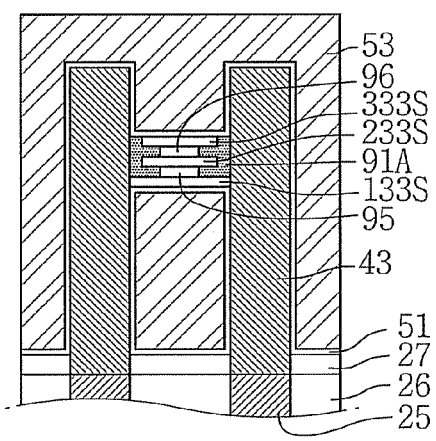

Referring to FIGS. 23 and 60, a support structure 133S, 233S, 333S, 91A, 95 and 96 may be formed between lower electrodes 43. The support structure 133S, 233S, 333S, 91A, 95, and 96 may include first, second and third supporters 133S, 233S and 333S, a glue layer 91A, and first and second intermediate insulating layers 95 and 96.

The glue layer 91A may be formed between the first and second supporters 133S and 233S and the first intermediate insulating layer 95, and may also be formed between the second and third supporters 233S and 333S and the second intermediate insulating layer 96. Further, the glue layer 91A may be formed between the lower electrodes 43 and the third supporter 333S, and between the lower electrodes 43 and the second supporter 233S. A capacitor dielectric layer 51 and an upper electrode 53 may be formed on the lower electrodes 43. The capacitor dielectric layer 51 may cover upper and lower parts of the support structure 133S, 233S, 333S, 91A, 95, and 96.

Figure 61:
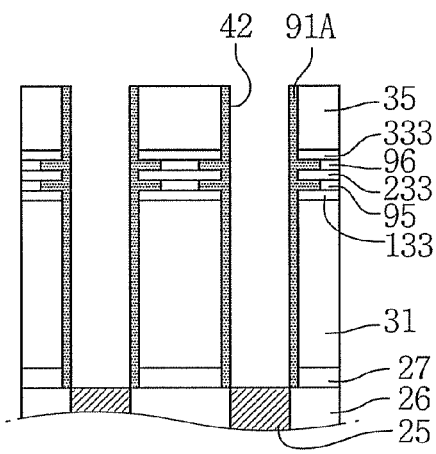

Referring to FIGS. 25 and 61, lower electrode holes 42 penetrating the second molding layer 35, the third supporter layer 333, the second intermediate insulating layer 96, the second supporter layer 233, the first intermediate insulating layer 95, the first supporter layer 133, the first molding layer 31 and the etch stop layer 27 may be formed. A glue layer 91A may be formed on sidewalls of the lower electrode holes. The glue layer 91A may cover sidewalls of the second molding layer 35, the third supporter layer 333, the second intermediate insulating layer 96, the second supporter layer 233, the first intermediate insulating layer 95, the first supporter layer 133, the first molding layer 31 and the etch stop layer 27. Subsequently, the semiconductor device including a constitution similar to that of FIG. 25 may be formed.

Tenth Embodiment

Figure 62:
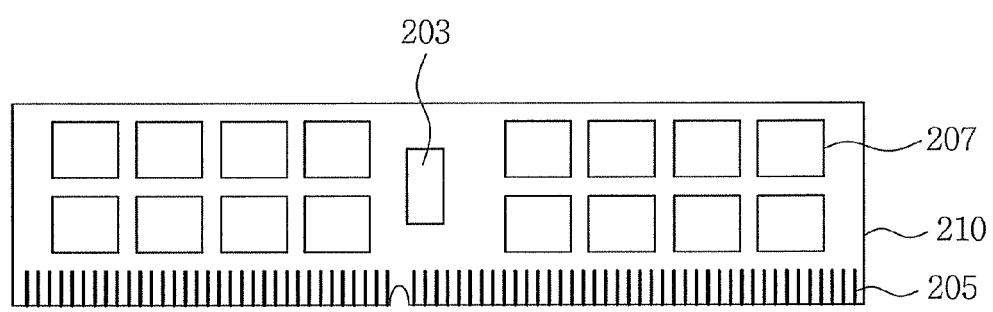
FIG. 62 is a layout diagram of a semiconductor module according to a tenth example embodiment of the inventive concepts.

FIG. 62 is a layout diagram of a semiconductor module according to a tenth example embodiment of the inventive concepts. Referring to FIG. 62, a semiconductor module according to a tenth example embodiment may include a module substrate 210, a plurality of semiconductor packages 207, and a control chip package 203. Input/output terminals 205 may be formed on the module substrate 210. At least one of the semiconductor packages 207 and the control chip package 203 may have a constitution similar to that described with reference to FIGS. 1 to 61. For example, the support structure (33S and 41 of FIG. 1) may be formed in the semiconductor packages 207 and/or the control chip package 203, and the bit line (13 of FIG. 1) may be electrically connected to the input/output terminals 205 via a bond finger formed on the module substrate 210.

The semiconductor packages 207 and the control chip, package 203 may be mounted on the module substrate 210. The semiconductor packages 207 and the control chip package 203 may be electrically connected to the input/output terminals 205 in series/parallel.

The control chip package 203 may be omitted. The semiconductor packages 207 may be formed of a volatile memory chip such as a dynamic random access memory (DRAM), and a static random access memory (SRAM), a non-volatile memory chip such as a flash memory, a phase change memory, a magnetic random access memory (MRAM), and a resistive random access memory (RRAM) or a combination thereof. In this case, the semiconductor module according to the tenth example embodiment may be a memory module.

Eleventh Embodiment

Figure 63:
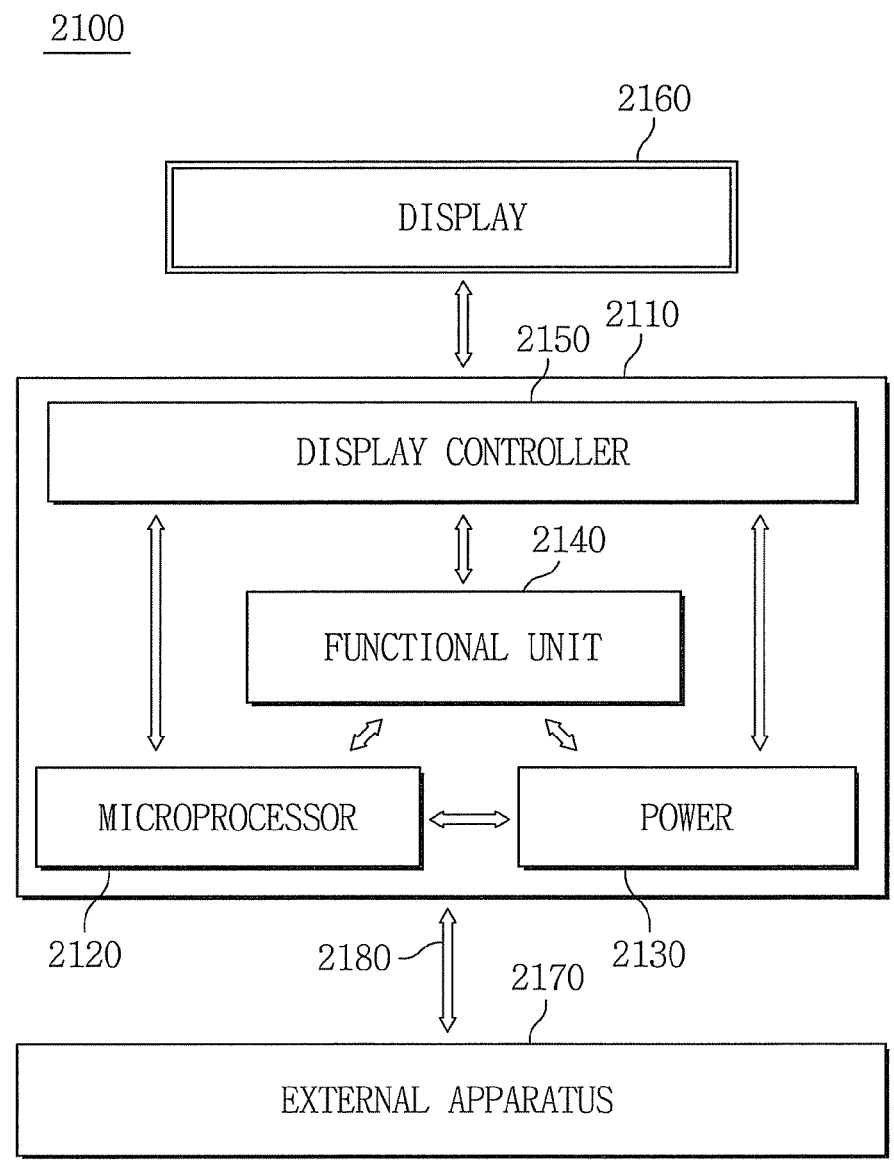
FIG. 63 is a system block diagram of an electronic apparatus according to an eleventh example embodiment of the inventive concepts.

FIG. 63 is a system block diagram of an electronic apparatus according to an eleventh example embodiment of the inventive concepts. Referring to FIG. 63, a semiconductor device similar to that described with reference to FIGS. 1 to 61 may be applied to an electronic system 2100. The electronic system 2100 may include a body 2110, a microprocessor unit 2120, a power unit 2130, a functional unit 2140 and a display controller unit 2150. The body 2110 may be a mother board formed of a printed circuit board (PCB). The microprocessor unit 2120, the power unit 2130, the functional unit 2140 and the display controller unit 2150 may be mounted on the body 2110. A display unit 2160 may be arranged in or on the body 2110. For example, the display unit 2160 may be arranged on the surface of the body 2110 to display an image processed by the display controller unit 2150.

The power unit 2130 may be supplied with a predetermined or given voltage from an external battery (not shown) and divide the received voltage to a required voltage level to supply the result to the microprocessor unit 2120, the functional unit 2140, the display controller unit 2150, etc. The microprocessor unit 2120 may receive a voltage from the power unit 2130 and control the functional unit 2140 and the display unit 2160. The functional unit 2140 may perform various functions of the electronic system 2100. For example, when the electronic system 2100 is a cellular phone, the functional unit 2140 may include many components capable of performing mobile phone functions including outputting an image to the display unit 2160 and outputting a voice to a speaker, by dialing or communication with an external apparatus 2170. When a camera is mounted, the system may function as a camera image processor.

In some example embodiments, when the electronic system 2100 is connected to a memory card for capacity expansion, the functional unit 2140 may be a memory card controller. The functional unit 2140 may transmit or receive a signal to or from the external apparatus 2170 via a wired or wireless communication unit 2180. Moreover, when the electronic system 2100 requires a universal serial bus (USB) for function expansion, the functional unit 2140 may function as an interface controller.

A semiconductor device similar to that described with reference to FIGS. 1 to 61 may be applied to at least one of the microprocessor unit 2120 and the functional unit 2140. For example, the support structure (33S and 41 of FIG. 1) may be formed in the microprocessor unit 2120 and/or the functional unit 2140, and the bit line (13 of FIG. 1) may be electrically connected to a bond finger formed on the body 2110.

According to the inventive concepts, a support structure can be provided between lower electrodes. The support structure can include a glue layer and a supporter. The glue layer can be formed of a material layer exhibiting improved bonding characteristics to the lower electrodes. The supporter can be formed of a material layer exhibiting desirable insulating characteristics and mechanical strength. The support structure can function to prevent or reduce the lower electrodes from moving downward.

The foregoing is illustrative of embodiments and is not to be construed as limiting thereof. Although a few embodiments have been described, those skilled in the art will readily appreciate that many modifications are possible in embodiments without materially departing from the novel teachings and advantages. Accordingly, all such modifications are intended to be included within the scope of the inventive concepts as defined in the claims. In the claims, means-plus-function clauses are intended to cover the structures described herein as performing the recited function, and not only structural equivalents but also equivalent structures. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A semiconductor device, comprising:
a plurality of metal patterns disposed on a substrate, each of the plurality of metal patterns having a greater vertical length than a horizontal length when viewed from a cross-sectional view; and
a support structure disposed between the plurality of metal patterns, the support structure having a supporter and a glue layer formed of different materials, the supporter having a band gap energy of at least 4.5 eV, and the glue layer being in contact with the plurality of metal patterns, the glue layer including,
an upper glue layer formed on a first surface of the supporter, and
a lower glue layer formed on a second surface of the supporter, the second surface opposing the first surface.

2. The device of claim 1, wherein the supporter has a dielectric constant of 10 or smaller.

3. The device of claim 1, wherein the supporter is formed of at least one of a SiN layer, a SiCN layer, a SiON layer and a combination thereof, and the glue layer is formed of at least one of a TaO layer, a TiO layer and a combination thereof.

4. The device of claim 1, wherein the support structure has a smaller thickness than the vertical length of the plurality of metal patterns when viewed from a cross-sectional view, and a distance between the support structure and lower portions of the plurality of metal patterns is greater than that between the support structure and upper portions of the plurality of metal patterns when viewed from a cross-sectional view.

5. The device of claim 1, wherein the glue layer is formed between the supporter and the plurality of metal patterns, and the glue layer is in contact with the supporter.

6. The device of claim 1, wherein the glue layer is connected between the plurality of metal patterns.

7. The device of claim 1, wherein the glue layer is attached to at least one surface of the supporter.

8. The device of claim 1, further comprising:
an insulating layer disposed on the substrate;
landing pads disposed in the insulating layer;
an etch stop layer disposed on the insulating layer; and
an auxiliary glue layer disposed between the etch stop layer and the plurality of metal patterns, wherein the plurality of metal patterns penetrate the etch stop layer to be in contact with the landing pads.

9. A semiconductor device, comprising:
switching devices disposed on a substrate;
landing pads connected to the switching devices;
first and second electrodes disposed on the landing pads; and
a support structure disposed between the first and second electrodes, the support structure having a supporter and a glue layer formed of different materials, the supporter having a first surface and a second surface, the glue layer being attached to one of the first surface and second surface of the supporter and being in contact with at least one of the first and second electrodes, the glue layer including,
an upper glue layer formed on the first surface of the supporter, and
a lower glue layer formed on the second surface of the supporter, the second surface opposing the first surface.

10. The device of claim 9, wherein the glue layer is thinner than the supporter when viewed from a cross-sectional view.

11. The device of claim 9, wherein the supporter includes:
an upper supporter formed on a first surface of the glue layer; and
a lower supporter formed on a second surface of the glue layer, the second surface opposing the first surface.

12. The device of claim 11, further comprising:
an intermediate insulating layer disposed between the upper and lower supporters,
wherein the intermediate insulating layer has an etch selectivity with respect to the upper and lower supporters, and the glue layer is formed between the intermediate insulating layer and the first and second electrodes.

13. The device of claim 12, wherein the glue layer is elongated between the upper supporter and the first and second electrodes.

14. A semiconductor device comprising:
a support structure disposed between first and second electrodes, the support structure having a supporter and a glue layer formed of different materials, the supporter including a first surface and a second surface, the glue layer being attached to one of the first surface and the second surface of the supporter and being in contact with the first and second electrodes, the glue layer including,
an upper glue layer formed on the first surface of the supporter, and
a lower glue layer formed on the second surface of the supporter, the second surface opposing the first surface.

15. The device of claim 14, wherein the glue layer is thinner than the supporter when viewed from a cross-sectional view.

16. The device of claim 14, wherein the supporter includes:
an upper supporter formed on a first surface of the glue layer; and
a lower supporter formed on a second surface of the glue layer, the second surface opposing the first surface.

17. The device of claim 16, further comprising:
an intermediate insulating layer disposed between the upper and lower supporters,
wherein the intermediate insulating layer has an etch selectivity with respect to the upper and lower supporters, and the glue layer is formed between the intermediate insulating layer and the first and second electrodes.

* * * * *